United States Patent [19]

Challa et al.

[11] Patent Number: 5,410,680
[45] Date of Patent: Apr. 25, 1995

[54] SOLID STATE MEMORY DEVICE HAVING SERIAL INPUT/OUTPUT

[75] Inventors: Nagesh Challa, Sunnyvale; Michel E. Gannage, Santa Clara, both of Calif.

[73] Assignee: Nexcom Technology, Sunnyvale, Calif.

[21] Appl. No.: 153,696

[22] Filed: Nov. 17, 1993

Related U.S. Application Data

[62] Division of Ser. No. 734,414, Jul. 23, 1991, Pat. No. 5,291,584.

[51] Int. Cl.$^6$ ............................................. G06F 12/00
[52] U.S. Cl. .............................. 395/500; 364/DIG. 1; 364/236.2; 364/927.81; 364/DIG. 2
[58] Field of Search ................... 364/DIG. 1 MS File, 364/DIG. 2 MS File; 395/250, 275, 400, 425, 500, 550, 800; 365/189.01, 189.12, 221, 222, 230.01, 244

[56] References Cited

U.S. PATENT DOCUMENTS

| | | | |
|---|---|---|---|
| 4,642,759 | 2/1987 | Foster | 364/200 |
| 4,780,819 | 10/1988 | Kashiwagi | 364/200 |
| 4,849,875 | 7/1989 | Fairman et al. | 364/200 |
| 4,860,252 | 8/1989 | Sykora | 364/900 |
| 5,033,027 | 7/1991 | Amin | 365/222 |
| 5,070,474 | 12/1991 | Tuma et al. | 395/500 |

OTHER PUBLICATIONS

"Oki Electric Develops 100-Mb 3.3 V Super-Small Solid State Disk with US Firm" Comline Computers (Oct. 19, 1992) p. 4.

Article entitled "Optimal Solid State Disk Architecture for Portable Computers" by Dan Auclair, Silicon Valley PC Design Conference (SVPC), Jul. 9–10, 1991, pp. 811–815.

Article entitled "A 16 Kbit Smart 5 V-Only EEPROM With Redundancy", by Lucero et al., IEEE Journal of Solid State Circuits, vol. SC-18, No. 5, Oct. 1983, pp. 539–544.

National Semiconductor data sheet entitled "NMC9345 1024-Bit Serial Electrically Erasable Programmable Memory", pp. 2-41 through 2-47.

Xicor data sheet entitled "X24C16 Electrically Erasable PROM", pp. 2-45 through 2-52.

*Primary Examiner*—Robert B. Harrell
*Attorney, Agent, or Firm*—Skjerven, Morrill, MacPherson, Franklin & Friel; David H. Carroll

[57] ABSTRACT

A magnetic media hard disk is emulated in a solid state hard disk having a disk controller, a data buffer, a microcontroller, and a disk emulator section. The disk emulator section includes a disk emulator interface and a memory array. The architecture of the memory array includes a number of memory banks which typically correspond to respective sectors of the emulated hard disk, but could correspond to respective groups of sectors of the emulated hard disk. Each of the memory banks has its own serial data line and its own serial clock line, and include a number of serial memory devices that connect to the bank serial data line and bank clock line with respective serial data and clock lines. Each of the serial memory devices also has a static address corresponding to a head address of the emulated hard disk. At any given time, one of the memory banks is selected by activation of its clock line based on the sector addressed, and one of the serial memory devices in the bank responds based on a comparison of its static address with head address data communicated on the serial data line. Other features described include serial memory device start sequences and bad bit replacement.

22 Claims, 14 Drawing Sheets

SOLID STATE MEMORY DEVICE HAVING SERIAL INPUT/OUTPUT

CROSS-REFERENCE TO RELATED DOCUMENTS

This application is a division of application Ser. No. 07/734,414, filed Jul. 23, 1991, now U.S. Pat. No. 5,291,584.

Two documents are submitted to the Patent and Trademark Office with this patent document, and hereby are incorporated herein in their entirety by reference. The first document is a preliminary data sheet entitled "NEX85C501: Disk Controller to Memory Interface Component." The second document is entitled "Read, Write and Format Process Flow."

BACKGROUND

Field of the Invention

The present invention relates to computer memory, and more particularly to solid state equivalents of magnetic media hard disks.

Background of the Invention

Magnetic media hard disks enjoy widespread use in computer systems, and especially in personal computer systems and computer workstations. A typical current generation hard disk includes one or more rigid platters of a plastic material coated on both sides with metal particles. Typically, one magnetic head is associated with each platter surface, although more heads may be used to increase access speed at the cost of increased complexity and expense. The platters are caused to spin at a high speed, typically 3600 rpm or greater, and the heads are designed to float just over the disk surfaces on a thin cushion of air caused by the spinning disks. The heads are moved across the spinning disk surfaces in a generally radially direction, for reading and writing magnetically encoded information from and to the disks. The heads are spaced just far enough away from the platter surfaces to avoid touching and damaging them, but are not so far away as to reduce signal strength and density. Since particulate matter in the air can enter the space between the heads and platter surfaces and cause damage to the platter surfaces, disk drives are assembled and sealed in a clean room environment, and the air within the disk chamber is microfiltered.

The physical organization of data on a disk is generally described by the terms track, sector, and interleave factor. "Tracks" are concentric rings of magnetically encoded data, and the track nearest the rim is generally designated track 0. A cylinder is a set of tracks having the same radial distance from the spindle. For example, in a two platter, two sided hard disk system in which the top side of the first platter is side 0, the bottom side of the first platter is side 1, the top side of the second platter is side 2, and the bottom side of the second platter is side 3; the four tracks 0 associated with sides 0, 1, 2 and 3 are collectively known as cylinder 0. The number of bytes in a track depends on the data encoding scheme used, examples of which include "modified frequency modulation," or "MFM," and "run-length limited coding," or "RLL." A "sector" is a segment of a track that is read or written at one time. The number of bytes in a sector depends on the operating system for which the manufacturer is designing; for example, DOS uses 512 bytes per sector. Contemporary disks are generally soft sectored, meaning that a sector address is written into the sector itself during disk physical formatting and the sector is identified by its address. Other information written during physical formatting includes synchronization bytes, which generally follow the sector address, and filler bytes, which are placed between sectors for timing tolerance. An "interleave factor" is the number of sectors inserted or interleaved between sequentially addressed sectors. An interleave factor of 1:1 means that sectors with sequential sector addresses are written in sequential track sectors. An interleave factor of 2:1 means that sectors with sequential sector addresses are written in every second track sector.

Operating systems such as DOS, which is used on personal computers from International Business Machines, Inc. and compatible personal computers, use logical sector numbering, which is a sequential or one-dimensional sector numbering scheme. While the DOS sector numbering scheme differs from the sector identification scheme used by the disk controller, this problem has been overcome by the use of built in ROM-BIOS that translates between the different schemes and issues calls that specify disk locations by side, track, and sector.

A disk must be physically formatted, and then logically formatted, before it can be used. Physical formatting, also known as low level formatting, involves formatting each track in accordance with the appropriate sector size and interleave factor. Physical formatting is to be distinguished from logical formatting, which is the organization of data on the hard disk and the records, tables, and directories established to find the data.

While disk capacity and performance is being continually improved, important hard disk factors such as access time, transfer rate, durability, power, and space requirements are closely related to mechanical and electro-mechanical aspects of the hard disk design, and economical improvements in these factors are difficult. For example, the access time of current generation magnetic media hard disks is typically no better than about 15 milliseconds.

SUMMARY OF THE INVENTION

An advantage of the present invention is the emulation of a magnetic media hard disk to achieve an improved, or low, access time and a comparable data transfer rate, relative to a magnetic media hard disk of equivalent density.

Another advantage of the present invention is the emulation of a magnetic media hard disk to achieve a durable data storage apparatus capable of operating in any position and resistant to shock effects.

Yet another advantage of the present invention is the emulation of a magnetic media hard disk to achieve low power dissipation, relative to a magnetic media hard disk of equivalent density.

These and other advantages are achieved by the present invention, which in one embodiment is a solid state apparatus for emulating a hard disk having a plurality of tracks per head and a plurality of sectors per track. This apparatus includes a number of serial memory devices, each having a serial data bus and a clock bus. An interface adapted for communicating disk control signals and data with a hard disk control system is operative to select among the respective pairs of serial data buses and clock buses of the serial memory devices for communicating serial data and clock signals to a group of the serial memory devices.

In another embodiment, a serial memory device having a serial data bus and a clock bus includes a control circuit that is connected to the serial data bus and the clock bus, as well as to an address shift register and a data shift register over respective serial lines. A memory array, which includes a plurality of columns of a predetermined width, is connected to a row decoder, which in turn is connected to the address shift register by an address bus. The columns of the memory array are connected to respective page latch circuits and to respective column select circuits. A data shift register is connected to the column select circuits by a word bus, and the width of the data shift register being the column width. Data is latched in parallel from the data shift register through a selected column select circuit to an associated one of the page latch circuits, for writing into an associated column of the memory array.

BRIEF DESCRIPTION OF THE FIGURES

In the drawings, in which like reference numerals indicate like parts.

DETAILED DESCRIPTION OF THE PREFERRED AND OTHER EMBODIMENTS

Figure 1:
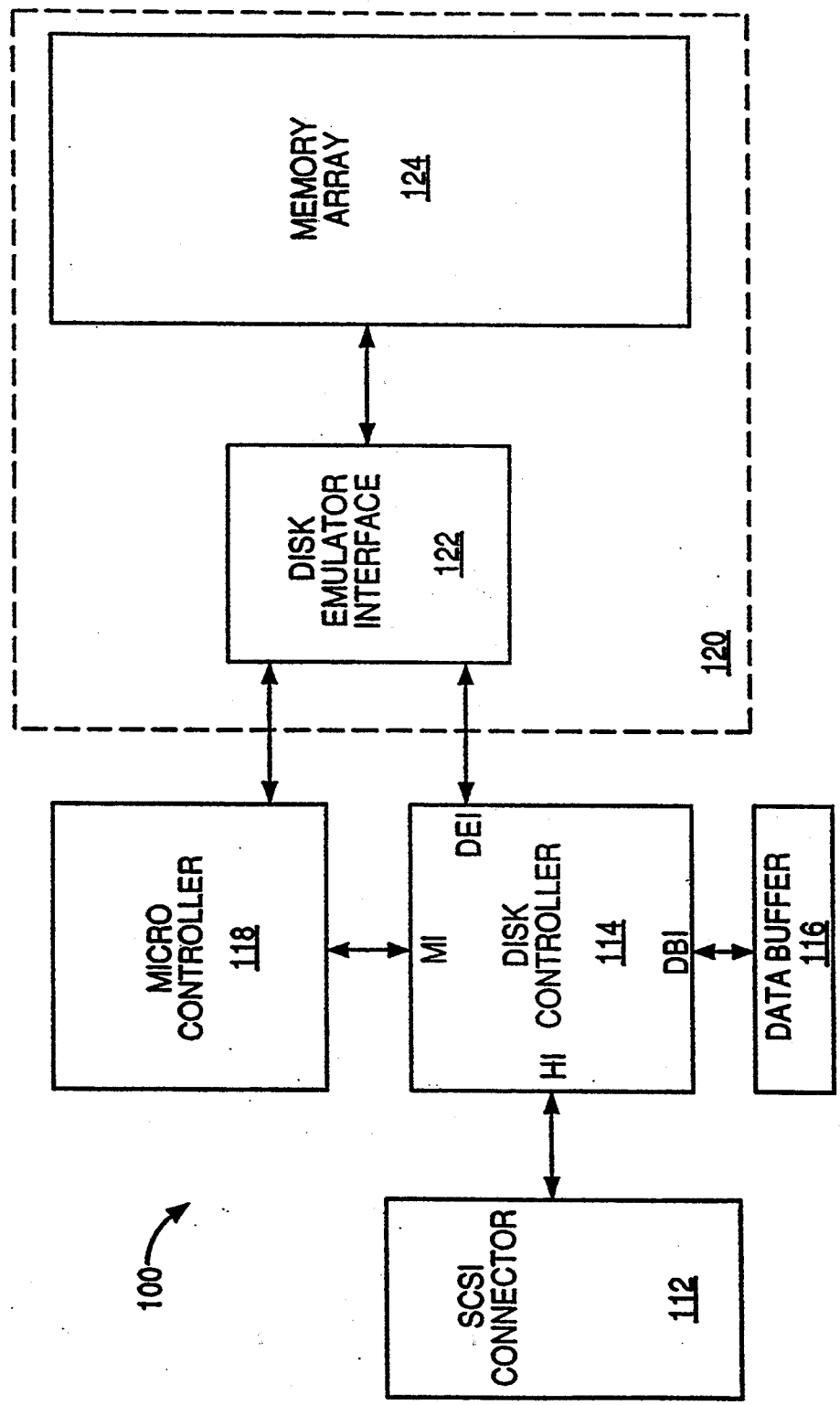
FIG. 1 is a block schematic diagram of a solid state hard disk.

A solid state memory disk peripheral 100 is shown in FIG. 1. The solid state disk 100 includes a disk controller 114, which interfaces to a SCSI host interface bus (not shown) in a manner compatible with ANSI specification X3.131-1986. The controller 114 is any suitable controller, including, for example, type CL-SH350 available from Cirrus Logic, Inc. of Milpitas, Calif. A SCSI connector 112, which plugs into the host interface bus, is connected to a host interface bus HI of the disk controller 114.

Figure 2:
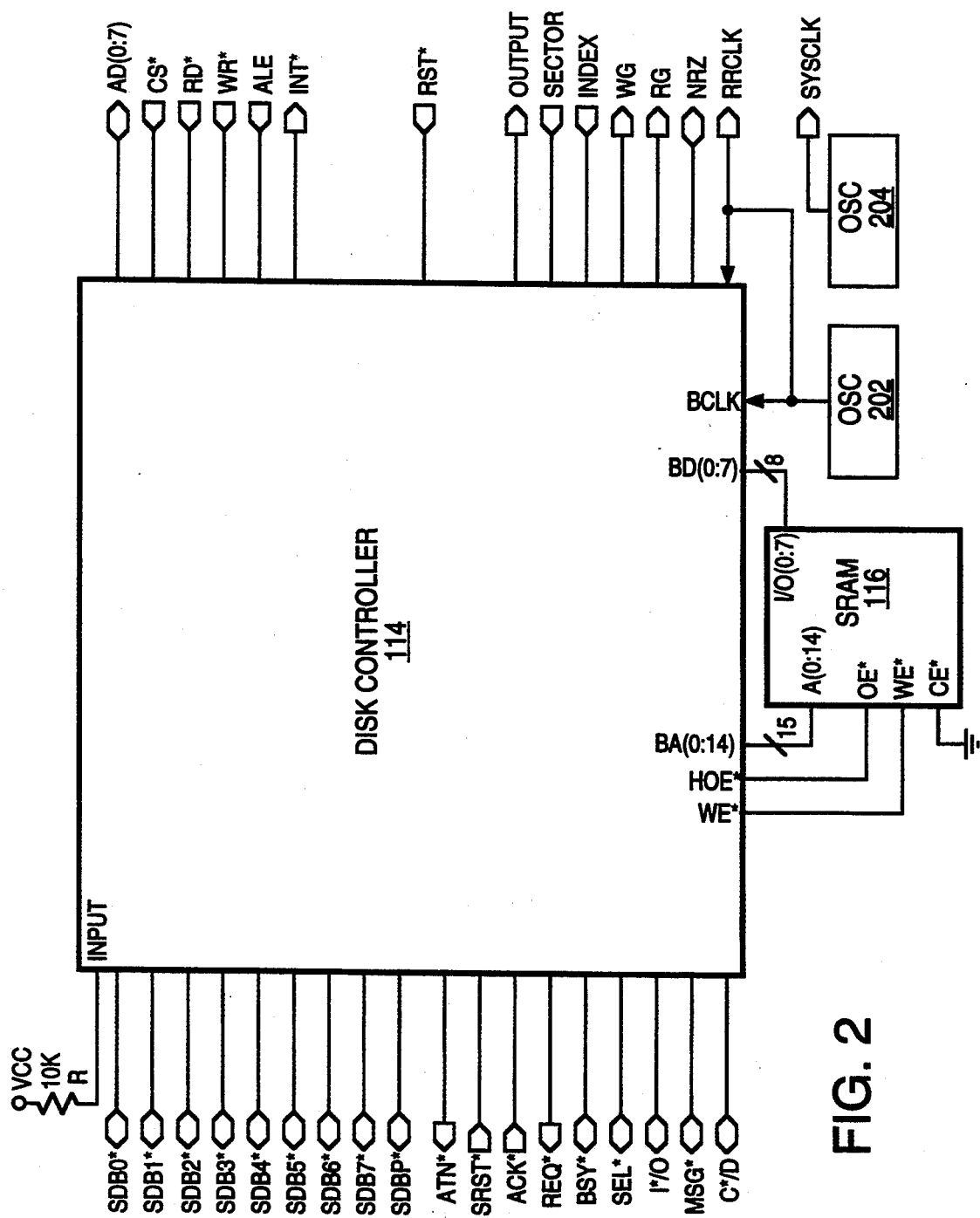
FIG. 2 is a block schematic diagram of a disk controller.

The disk controller 114 is shown in further detail with associated circuitry in FIG. 2. Note that in this Figure, as in other Figures, an asterisk following the signal name indicates active low. Note also that in this Figure, as in other Figures, a bidirectional bus may be shown as a unidirectional bus, if that implementation is preferred in the embodiment illustrated.

The Host interface bus HI includes an eight bit SCSI data signal SDB(0:7), SCSI data bus parity bit SDBP, attention signal ATTN, SCSI reset signal SRST, acknowledge signal ACK, request signal REQ, busy signal BSY, select signal SEL, input/output signal I/O, message signal MSG, and command/data signal C/D.

The microcontroller interface bus MI includes eight bit address/data signal AD(0:7), clock signal CS, read signal RD, write signal WR, address latch enable signal ALE, interrupt signal INT, reset signal RST, and system clock SYSCLK. The disk controller 116 is mapped into external memory or data at address C000-FFFF hex. The disk controller 114 only decodes addresses 40-FFh. The system is designed such that the disk controller 114 is selected when the microcontroller 116 addresses any port 40-FFh at a high address of COXX through FFXX hex.

The bi-directional data buffer interface bus DBI connects directly to a 32 Kbyte static RAM 116 for the assembly of blocks of data from the Host for transfer to the solid state memory disk 100, or from the solid state disk 100 for transfer to the Host. The data buffer interface bus DBI includes bus address signals BA(0:14), bus data signals BD(0:7), bus clock signal BCLK, memory output enable signal MOE, and write enable signal WE. The bufferred blocks are burst at high speeds to minimize the time that the Host is connected to the SCSI host interface bus. For Host writes, all the data is written to the buffer 116 and then written to the disk emulator section 120 (FIG. 1) of the solid state disk 100 at slower speeds, through the data emulation interface bus DEI. In the case of a disk read, the data buffer interface DBI allows for the reading of 64 sectors of data from the disk emulator section 120 through bus DEI, for the Checking and correction of data errors if necessary, and then for the transfer of all the data to the Host at once, through the host interface bus HI. Data is passed to or from the host interface HI as well as to or from the disk interface DI in byte wide format, and is serialized to the disk or deserialized from the disk for these buffer transfers. In the case of larger transfers, a streaming effect takes place where the data buffer interface is used to gauge the transfers and make optimal use of the SCSI Host bus.

As shown in FIG. 2, the control signals for the memory 116 are supplied by the disk controller 114. The memory output enable MOE of the disk controller 114 is connected directly to the output enable control input OE* of the memory 116 for fast accesses. The write enable signal WE* of the disk controller 114 is connected to the write enable control WE*, or more generally to the memory read/write control, of the memory 116. The chip enable control CE* of the memory 116 is normally tied directly to ground. Alternatively, as a power saving feature, chip enable CE* of the memory 116 is connected to a microcontroller I/O bit and enabled only during active data transfers. Microcontroller access to the memory 116 for data correction, parameter tables or other system dependent information also is provided.

The disk controller 114 also includes a disk emulator interface bus DEI that provides a full complement of disk control signals to and from the disk emulator interface 22. These include sector signal SECTOR, index signal INDEX, write gate signal WG, read gate signal RG, serial data input/output NRZ, and read-reference serial data clock RRCLK. Bus OUTPUT is not used. The read gate and write gate outputs are sent directly to the disk emulator interface 22 for control over the read and write operations. The index and sector status are synthesized by the disk emulator interface 22 to permit transparent operation of the disk controller 114. The NRZ serial data is handled by the disk emulation interface 22 as if a true disk interface were present. The read/reference clock signal RRCLK is an input to the disk controller 114 and to the disk emulation interface 22 to keep the disk operations synchronized.

Oscillators 202 and 204 provide the various clock signals for the solid state memory disk peripheral 100. In the embodiment of FIG. 2, oscillator 202 runs within the range of twenty to thirty-two Megahertz, and furnishes clock signals RRCLK and BCLK. Oscillator 204 runs at 16 Megahertz, and furnishes clock signal SYSCLK. In other applications and systems, oscillators 202 and 204 may be set at different frequencies, as desired.

Figure 3:
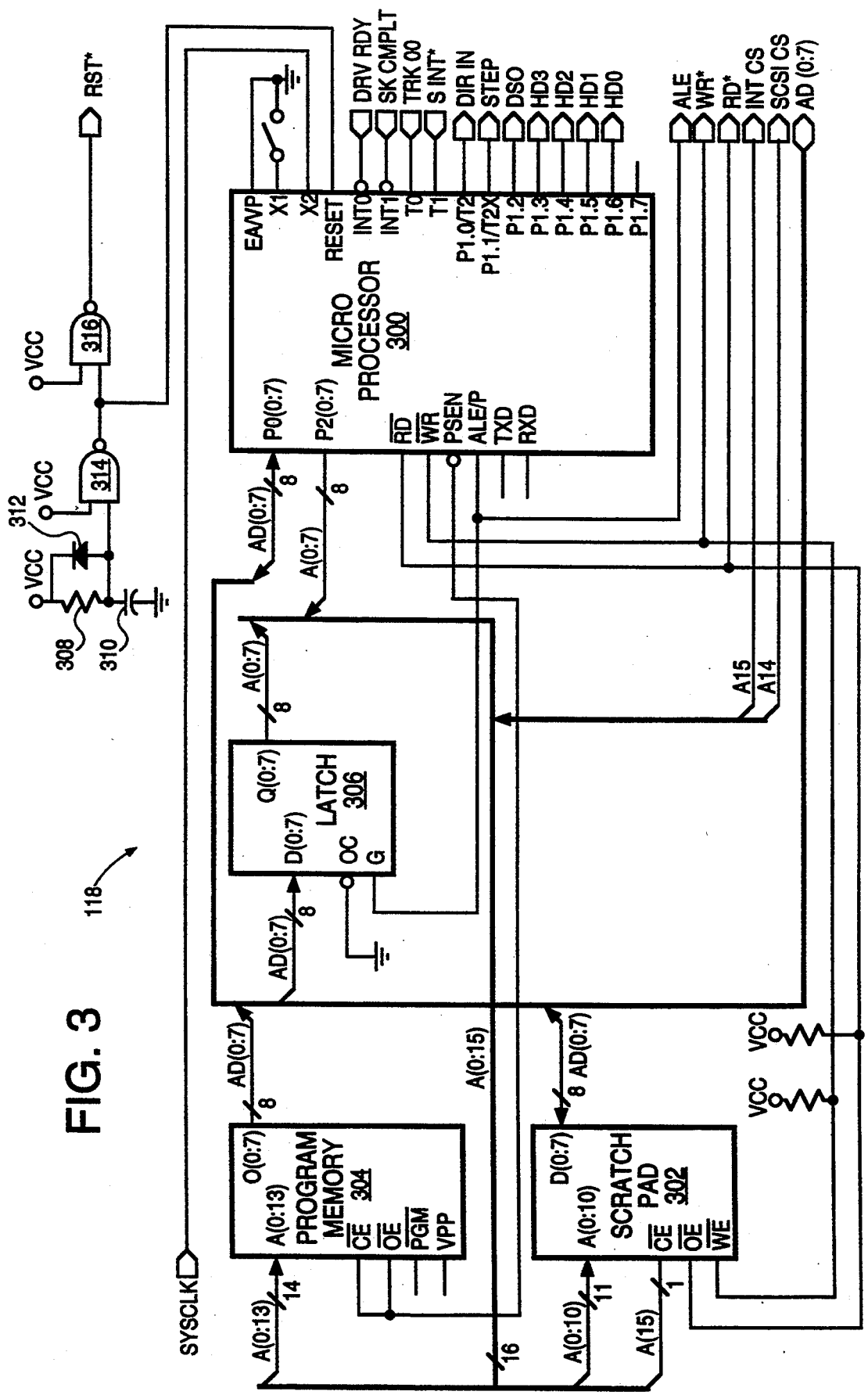
FIG. 3 is a block schematic diagram of a microcontroller.

The microcontroller 118 shown in FIGS. 1 and 3 is provided for establishing the initial operating parameters of and for system control of the disk controller 114 and the disk emulator interface 122, the address and data timing and control requirements of which must be compatible with those of the system microcontroller 118. The microcontroller 118 also provides for the execution of disk based commands and the monitoring of their status, and for SCSI command decoding, execution, status and termination.

Microcontroller 118 includes microprocessor 300, which is any suitable microprocessor, including types 80C32 and 80C52 available from Intel Corporation of Santa Clara, Calif. Three devices reside in the external memory address map of the microcontroller 118. The SCSI disk controller 114 can be addressed anywhere in the range from COXX to FFXX hex. The disk emulator interface 122 is located at any address from 80XX to BFXX hex. A scratchpad memory 302 is located at the base addresses anywhere from 00XX to 78XX hex. The desired address on the multiplexed address/data bus AD(0:7) is latched into the disk controller 114 or the disk emulator interface 122 by address latch enable signal ALE supplied from port ALE/P of the microprocessor 300.

Although the microprocessor 300 typically contains from 128 bytes to 256 bytes of internal SRAM, this is generally insufficient for SCSI based command protocols. An external random access memory 302, preferably a SRAM, of 2 Kbytes minimum is used for "scratchpad" purposes, including the processing of stacks, system parameters, disk address constants, and many blocks of Host associated status for Inquiry, Request Sense and other similar commands.

In addition to the external scratchpad SRAM 302 for dynamic variables and system parameters, the microprocessor 300 also requires between 8 and 16 Kbytes of program memory to implement the SCSI command set and protocol. An external program memory 304, which preferably is EPROM memory, is used for this function and is solely mapped into the program memory of microcontroller 118 using the signal PSEN* or a similar control signal from the microprocessor 300 indicating a program instruction or data fetch. The program memory 304 may be thought of as firmware.

The microprocessor 300 is responsible for driving a number of non-real time disk functions. The various programmed I/O port bits are used for driving these functions and receiving status information. One such function is the drive selection, although only one drive happens to be present in solid state disk 10. Drive select is made by asserting bit P1.2 associated as the drive select function called DS0. This is used to qualify all disk operations and gate all drive status signals. Drive ready DVR RDY is a status signal into the microprocessor 300 that in a magnetic media -based system normally indicates that the drive has spun up. In the solid state disk 100, the drive ready signal DVR RDY is returned from the disk emulator interface 122 directly as a reflection of the drive selection signal DS0. Another such function is the head address, which is driven from four output lines HD0, HD1, HD2 and HD3 to decode the current head address when DS0 is active. Alternately, this function is performed simply by writing to the disk emulator interface 122.

Another non-real time disk function is the seek function, which is embedded in the microcontroller and associated firmware of the program memory 304. The required cylinder address is calculated and then an offset from the current cylinder address is derived by suitable address mapping algorithms. This yields the required number of STEP pulses to issue. The microcontroller 118 actually seeks to the target cylinder by setting the direction signal DIR IN to the proper polarity, which is "asserted" to seek inward and "deasserted" to seek outward, and then issues the required number of STEP pulses by toggling the output port bit STEP associated with the STEP signal. The disk emulator interface 122 deasserts the seek complete status signal SK CMPLT after the occurrence of the first STEP pulse. When the disk emulator section 120 has arrived at the cylinder address, it asserts the seek complete signal SK CMPLT back to the microcontroller 118.

The power-on reset function is performed by an external one-shot circuit comprising NAND gates 314 and 316, diode 312, resistor 308, and capacitor 310. Output RST is taken from NAND gate 316 and furnished to the disk controller 114 and the disk emulator interface 122. The output of NAND gate 314 is furnished to the RESET input of the microprocessor 300, which detects the first step pulse issued, and deasserts seek complete SK CMPLT and times-out the STEP pulses to aid in the emulation of bufferred seek mode.

The microprocessor 300 reads a port of the disk emulator interface 122 for determining the SCSI ID address and SCSI data bus parity enable. The first three status bits encode one of eight SCSI address IDs, and the last bit is for SCSI parity. If the bit is a logic high, then parity is checked on the SCSI data bus. If the bit is a logic low, then the parity function is disabled. Note that parity must be coherent for the entire system. If one device has parity enabled, all devices must have parity enabled.

Chip select signals SCSI CS and INT CS are used to select the disk controller 114 or the disk emulator interface. Signal TRK 00 is asserted when the cylinder address is zero. Interrupt signal S INT is to interrupt the microprocessor 300. An active step is indicated by signal STEPACT.

Figure 4:
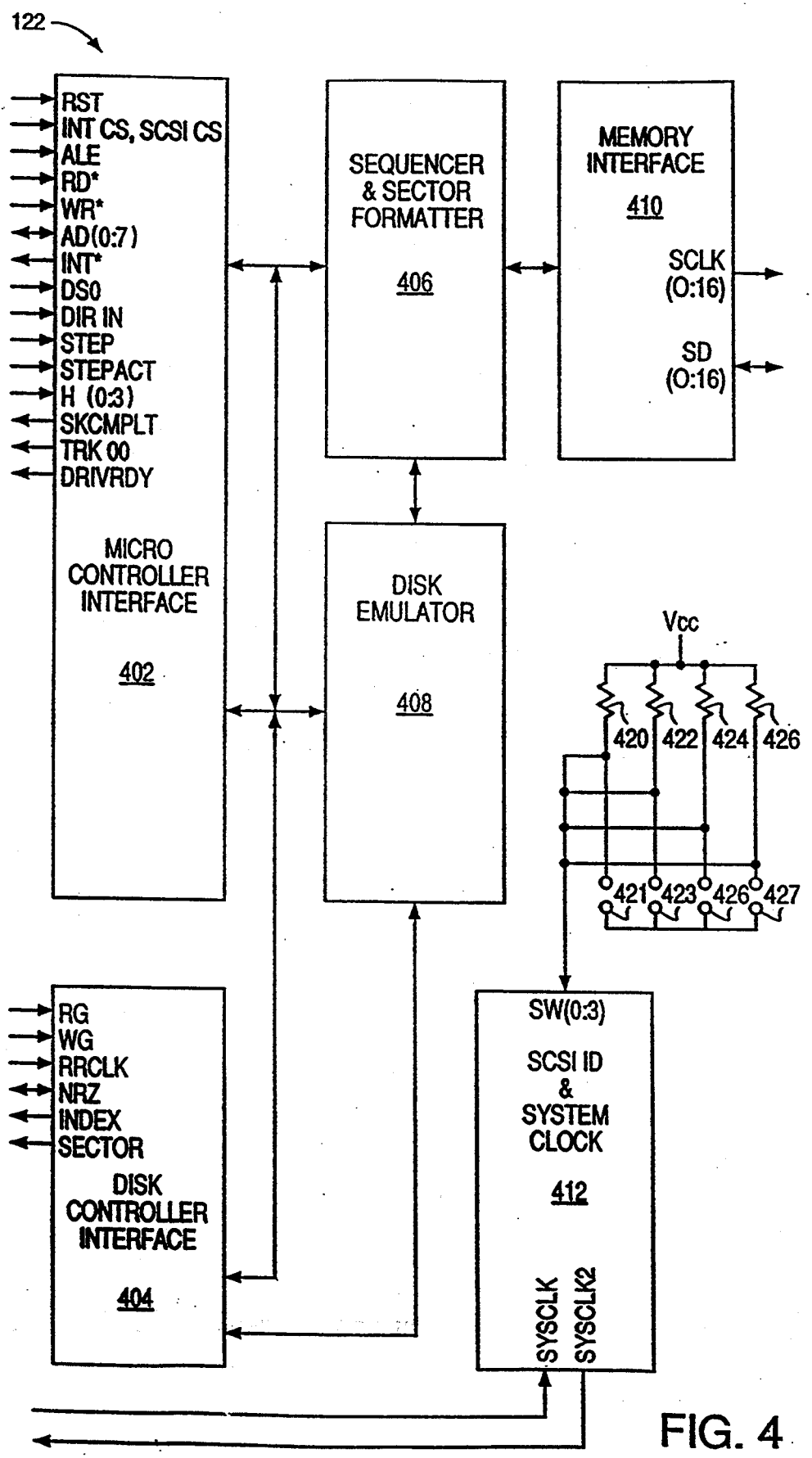
FIG. 4 is a block schematic diagram of a disk emulator interface.

The disk emulator interface 122, which is part of the disk emulator section 120, is shown in more detail in FIG. 4. The microcontroller interface 402 interfaces to the microcontroller 118 with a slave type of Control- /Address/Data bus. Several internal registers are accessed by the microprocessor 300 for read or write operations. These registers are used for initializing the disk emulator interface 122 into different modes of operation, as well as to issue commands or get status. The disk controller interface 404 interfaces to the disk controller 114. The disk emulator 408 is connected to the sequencer and sector formatter 406, the microcontroller interface 402, and the disk controller interface 404 over suitable buses. It serves a number of functions, including drive selection and drive ready logic, seek and seek complete functions, cylinder address and track zero logic, index status and index simulation logic, head select logic, and sector address latch logic. The sequencer and sector formatter 406 is connected to the microcontroller interface 402, the disk controller interface 404, the disk emulator 408, and the memory interface 410 over suitable buses. The memory interface 410, which is connected to the sequencer and sector formatter 406 over suitable buses, interfaces to memory array 124. Communication with the memory array 124 is through serial clock output bus SCLK(0:16) and serial data I/O bus SD(0:16).

The disk emulator interface 122 includes four user accessible switches, which are jumpers 421, 423, 425 and 427, for setting system parameters, in accordance with usual SCSI based system requirements. The inputs SW(0:3) of the SCSI ID and System Clock 412 are connected to power through 10 Kohm pull-up resistors 420, 422, 424 and 426 respectively. Switches 421, 423, 425 and 427 can set inputs SW(0:3) to logic low by being jumpered to ground. The function assigned to switches 421, 423, 425 and 427 are for the SCSI ID address and SCSI data bus parity enable. The microprocessor 300 reads one of eight SCSI address IDs encoded in the first three status bits. The last bit is for SCSI parity. If the last bit is a logic high, no jumper inserted, then parity is checked on the SCSI data bus. If the last bit is a logic low, jumper inserted, then the parity function is disabled.

Figure 5:
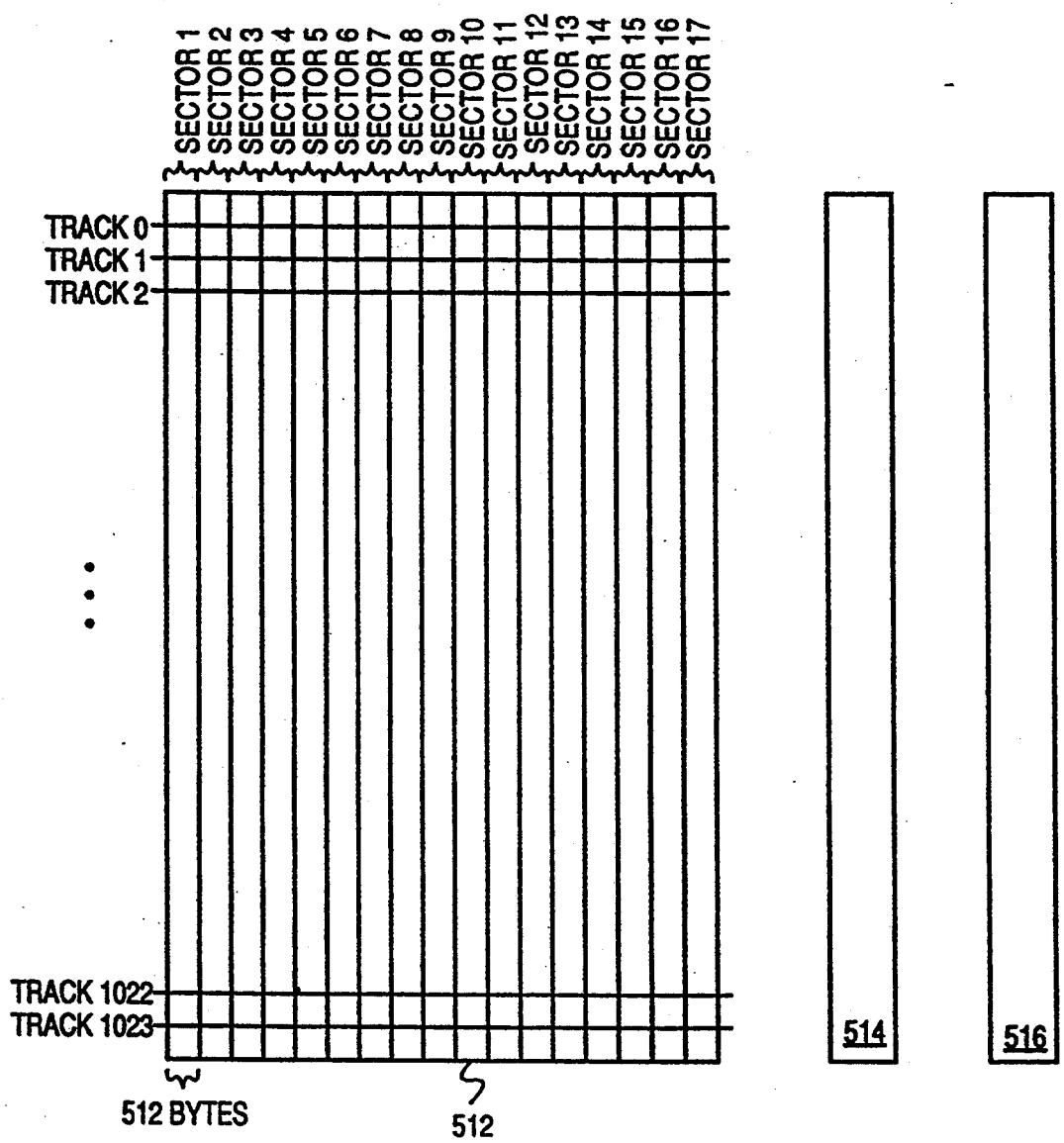
FIG. 5 is a schematic representation of the organization of a typical hard disk.

The disk emulator section 120 emulates a twenty megabyte (20 MB) magnetic media hard disk having 512 bytes per sector, 17 sectors per track, 1024 tracks per head, and three heads. Note that the unformatted capacity of the 20 MB magnetic media hard disk is 26,738,688 bytes. This arrangement is illustrated schematically in FIG. 5, in which elements 512, 514 and 516 correspond respectively to the three heads. In conventional magnetic media hard disk terms, the schematic representation of FIG. 5 shows that each head 512, 514 and 516 accesses 1024 tracks on, respectively, side 0, side 1 and side 2 of the two platens of the disk. It will be understood that the 20 MB hard disk configuration is an example of only one of many possible hard disk configurations that are capable of being emulated with the architecture described herein, including 8 MB and 16 MB hard disks, as well as the popular 40 MB magnetic media hard disks. While the number of bytes per sector is generally fixed at 512 and the number of sectors is typically seventeen for personal computers such as the model PC-AT (Trademark) available from IBM Corporation of Armonk, N.Y., and computers compatible therewith, the number of tracks and the number of heads may vary for different computer systems.

Figure 6:
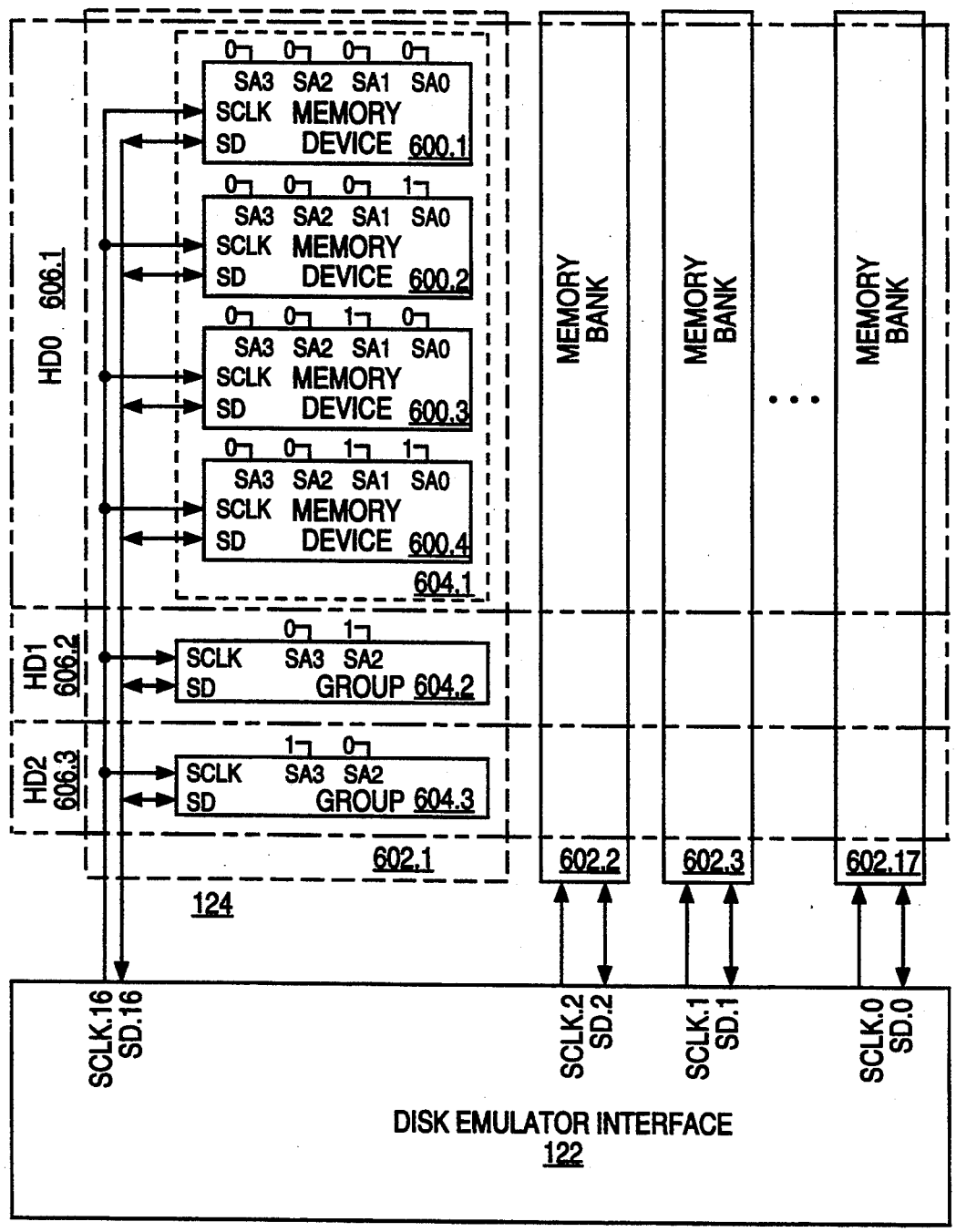
FIG. 6 is a block schematic diagram of a memory array having a plurality of serial memory devices.

The disk emulator section 120 for a 20 MB magnetic media hard disk also includes a memory 124, which is shown in greater detail in FIG. 6. The memory 124 is divided into seventeen banks 602.1–602.17, in accordance with the convention that each bank corresponds to one of seventeen sectors (FIG. 5) of the magnetic media hard disk being emulated. If desired, however, a bank may correspond to two or more sectors depending on the convention being adhered to, and a fewer or greater number of banks may be used depending on the magnetic media hard disk being emulated. Moreover, additional banks may be included to provide for redundancy in the event of defective memory.

Each of the banks 602.1–602.17 includes three sections, or groups of memory cells, corresponding to the heads of the emulated hard disk. For example, bank 602.1 includes sections 604.1, 604.2 and 604.3 corresponding to heads HD0 (606.1), HD1 (606.2) and HD2 (606.3). Each bank section such as 604.1 includes four serial one Megabit EEPROM memory devices, or integrated circuits, such as serial memory devices 600.1–600.4, although a greater or fewer number of integrated circuits may be used depending on the storage capacity of the integrated circuits and the magnetic media hard disk being emulated. For example, in four Megabit process technology, each bank section such as 604.1 need include only one serial four Megabit EEPROM memory device.

Each of the chips 600.1–600.4 is a customized EEPROM serial memory device configured basically as 256 rows by 4240 columns, or somewhat greater than one megabit. Hence, the basic size of the memory array 124 is 27,678,720 bytes. Each row is uniquely addressable, and the 4240 bits of each row are organized as 256 words of 16 bits each, plus other bits for synchronization, redundancy, and cycle count. Provision may be made for redundant memory, if desired. For example, the memory device 600 may include four redundant rows and 3 redundant columns.

Besides power and ground (not shown), each memory device 600 communicates using, basically, 2 serial signals: serial clock SCLK and serial data SD. The serial clock SCLK is an input to the memory device 600 and an output from the disk emulator interface 122. Serial clock SCLK clocks serial data from the disk emulator interface 122 into the memory device 600 during Write mode, and clocks serial data from the memory device 600 into the disk emulator interface 122 during Read mode. The serial data SD is an I/O to the memory device 600 and an I/O to the disk emulator interface 122.

As shown in FIG. 6, all the serial clock pins SCLK of the memory devices 600 within one bank (for example, memory devices 600.1–600.4 in bank 602.1, section 604.1) are commonly connected, and all the serial data pins SD of the memory devices 600 within one bank are also commonly connected. Accordingly, when packaged as a separate chip, the disk emulator interface 122 interfaces to each of the banks 602.1–602.4 of the memory 124 with only 2 pins. So, for n banks of memory, 2n lines connect the disk emulator interface 122 to memory 124.

In the memory array 124, bank selection is made by activating only the pair of lines SCLK# and SD# connected to the selected bank. The others of the lines SCLK(0:16) and SD(0:16) remain inactive. With this arrangement, each of the drivers (not shown) for the lines SCLK(0:16) and SD(0:16) from the memory interface 410 of the disk emulator interface 122 has a load of only one bank of memory devices 600, so that high data rates of, for example, 20 MHz can be maintained. Moreover, these drivers need only be small, low power drivers, so that power consumption is minimized. Moreover, power consumption is further minimized in that only one of clock signals SCLK(0:16) is active at a time, and the active signal SCLK# toggles only during operations such as read, write, and ready/busy poll, and not between operations.

Note that while the disk emulator interface 122 and the memory array 124 are arranged in a serial architecture, a parallel architecture may be achieved, if desired, by modifying disk emulator 122 to access two or more pairs of lines SD# and SCLK#. A parallel architecture of this type would be useful in connection with, for example, "parallel" disk controllers and in certain memory card applications.

Bank selection may be achieved even if only one of the buses SCLK and SD from the memory interface 410 of the disk emulator interface 122 has a number of lines corresponding to the number of banks 602 in the memory array 124. For example, if the bus SCLK were to comprise seventeen clock lines and the serial data bus only one line, bank selection would be made by activating only one of the clock lines SCLK(0:16) with the single SD line active in either input or output mode. This arrangement would, however, require that the driver for the single SD line be appropriately sized to accommodate the larger load imposed by its connection to seventeen banks. Similarly, if the serial data bus SD were to comprise seventeen I/O lines and the clock bus only one line, bank selection would be made by activating only one of the serial data lines SD(0:16) in either input or output mode while driving the single clock line SCLK. This arrangement would require not only that the driver for the single clock line SCLK be appropriately sized to accommodate the larger load imposed by its connection to seventeen banks, but would also cause greater power consumption due to the clocking of seventeen banks.

Each memory device 600.1–600.4 includes static address terminals SA0, SA1, SA2 and SA3. The static address terminals SA3 and SA2 of each serial memory device 600 are connected to Vcc or ground, as appropriate, for establishing the head address of the memory device. As the memory array 124 corresponds to a three head hard disk, the head address may be HD0, which is represented by 606.1 in FIG. 6; HD1, which is represented by 606.2; or HD2, which is represented by 606.3. The static address terminals SA1 and SA0 of each serial memory device 600 are connected to Vcc or ground, as appropriate, for establishing the range of track addresses contained by a particular memory device 600. In a typical hard disk, a head reads 1024 tracks, so that memory device 600.1 contains the first 256 tracks, memory device 600.2 contains the next 256 tracks, memory device 600.3 contains the next 256 tracks, and memory device 600.4 contains the last 256 tracks in the head section 604.1.

It will be appreciated that in a four megabit serial memory device, the static address terminals SA1 and SA0 need not be present. Since one sector of each track typically accessible by a single head are contained in a four megabit memory device, use of four megabit memory devices 600 precludes the need for a track range identifier.

The format in the memory 124 is similar to the magnetic media hard disk format to permit emulation of magnetic media hard disks with minimum hardware and firmware changes. The memory 124 comprises a three byte synchronous field, a three byte cycle count field, a 512 byte data field, and a seven or eleven byte error correction code field, depending on the error correction code used. The cycle count reflects the number of cycles that the particular associated sector or bank has been written, or programmed. The Sync bytes are used to identify whether the current sector is good or bad. A bad current sector has a specific byte pattern followed by the physical address of the sector it points to repeated several times. The disk emulator interface 122 reads this information in a Ready/Busy Poll operation, each time a sector is accessed for a read or a write operation.

In an alternative arrangement for utilizing good bits of a bad sector, additional fields are allocated to store the number of defective bits, if any, in the sector, and to indicate the location of the bad bits by clock count. In this arrangement, the disk emulator interface 122 uses the Sync field to ignore the bad bits as it counts the full sector of data, and counts extra clocks to read the data from the bits that replace the bad bits on the sector.

The operation of the disk emulator section 120 in its principal modes, the read and write modes, is described with reference to FIGS. 4 and 6. It will be appreciated that the disk emulator section 120 may be operated in other modes for such purposes as testing and redundancy operations.

After the head, cylinder, and sector addresses are initialized to their proper value, the microcontroller 118 writes into a command register (not shown) in the microcontroller interface 402 a specific command. The head and sector address are decoded in the disk emulator 408, which prepares to transmit to a specific bank in accordance with the decoded addresses. Next, the sequencer 406 is initialized.

Figure 13:
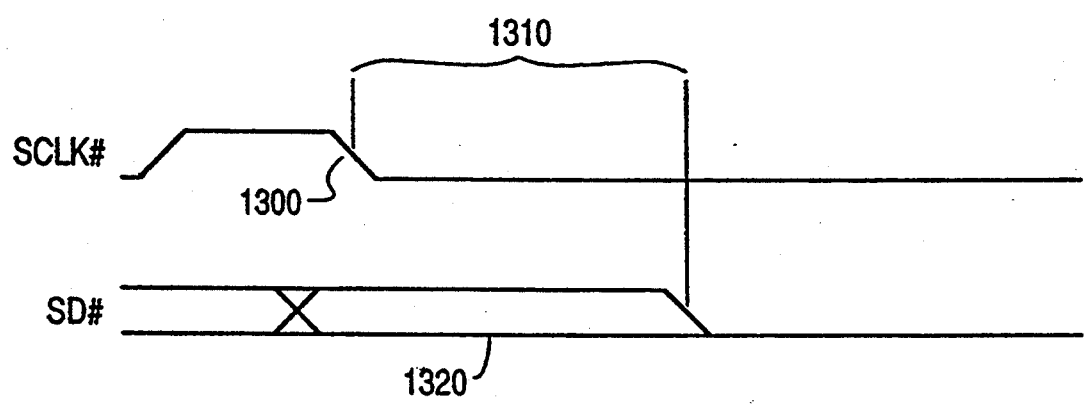
FIGS. 13 and 14 are representations of signal levels usefull in understanding a Start condition and an Idle condition.

The appropriate one of the memory devices 600 is selected beginning with a Start condition following an Idle condition, as follows. The serial memory device 600 enters an Idle state after power up. It remains in the Idle state as long as SCLK is low. It also enters an Idle state at the end of an instruction, approximately 2 microseconds after the SCLK# is stopped. FIG. 13 shows clock signal SCLK# and serial date signal SD# at the end of as instruction, the disk emulator interface 122 stops the clock SCLK# after transistion 1300 for a period 1310 af 2 microseconds before starting another instruction on the same bank after transistion 1300. Generally, all operations are preceded by the Start condition, which informs the memory device 600 that a command sequence follows. A Start condition is detected by the serial memory device 600 when a low to high transistion occures in the SCLK# signal after SCLK# and SD have been in a low state continuously for a period of approximately 2 microseconds.

Figure 14:
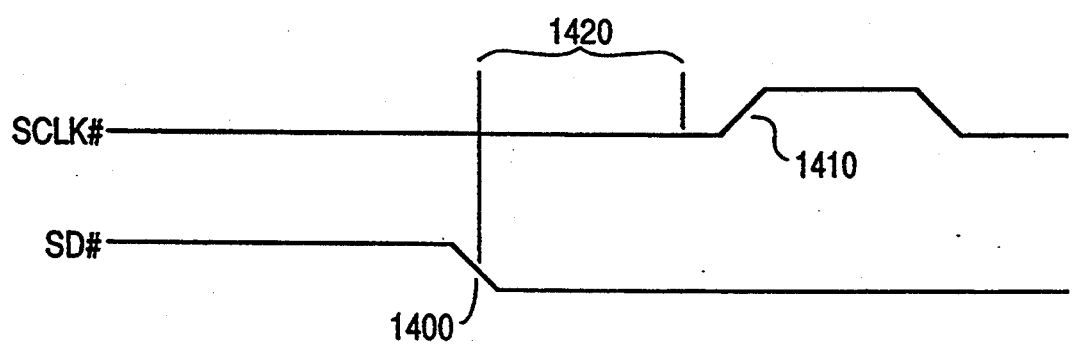

In an alternative technique, a Start condition is detected by the serial memory device 600 when a high to low transition 1400 (FIG. 14) occurs in the signal on line SD# while the signal on line SCLK# is low. This is an unusual condition that is not encountered in normal data transfer either from or to the serial memory device 600. The Start condition initiates an internal two hundred nanosecond timer (not shown). If no transition such as transition 1410 occurs in the signal on line SCLK# for a period 1420 of at least two hundred nanoseconds, the Start condition is confirmed as genuine, and transitions in the signal on line SD# are decoded. If a transition occurs in the signal on line SCLK# within the period 1420, the timer is reset and the Start condition is invalidated.

Another suitable Start sequence, which would require the presence of another clock signal, would be to hold both SCLK# and SD# LOW for a predetermined number of external clock cycles.

Generally, a Start sequence is useful to avoid the detection of spurious signals, such as those caused by skews between signals on lines SD# and SCLK#, as Start conditions. Moreover, the use of a Start sequence accommodates the presence of other devices on the same SD# and SCLK# pair.

As an example of an operation, assume that the first sector 602.1 of track 260 of the HD0 head 606.1 is to be read or written. The sequencer 406 begins by imposing a Start sequence on lines SD16 and SCLK16 associated with the bank that corresponds with the decoded sector address 1. Next, the sequencer 406 drives through memory interface 410 the clock line SCLK16 associated with the bank that corresponds with the decoded sector address 1. Beginning with the first clock, sequencer 406 clocks out on serial data line SD16 an opcode, a static address that includes the track range identifier 01, a row address, and a static address that includes head address 00 corresponding to HD0. The disk emulator section 120 may be designed for a different order, if desired. Note that track range identifier 01 is part of the track address indicating that the desired track 260 is in the second set of 256 tracks. The other part is the row address.

The sector address and track range identifier are clocked through disk emulator interface 122 into each memory device 600 in bank 602.1, including memory devices 600.1, 600.2, 600.3 and 600.4, in accordance with SCLK.16. Each memory device 600 in bank 602.1 compares its static addresses with the head address and track range identifier communicated on serial data line SD16, but only memory device 600.2 realizes a match. The rest of the track address on serial data line SD16 is clocked into the memory device 600.2. After the last bit is shifted out, the sequencer 406 clocks out a number of zero bits before releasing the bus.

If the opcode is a Ready/Busy Poll instruction and the memory device 600.2 containing the sector addressed is busy, the memory device 600.2 responds on serial data line SD16 with a busy flag, a sync sequence, and a count sequence, although the sync sequence and count sequence are ignored when the memory device 600.2 is busy. Other techniques to signal busy, such as driving the serial data line SD16 to a particular logic level, may be used as well. If the memory device 600.2 containing the sector addressed is ready, the memory device 600.2 responds on serial data line SD16 with a ready flag, a sync sequence, and a count sequence. Other techniques to signal ready, such as internally releasing the serial data line SD16 and pulling it high with pullup resistors that have been enabled at the beginning of the poll, may be used as well.

The sequencer 406 then responds with a read or write sequence. The read sequence is similar to the Ready/Busy Poll sequence, except that after the ready flag is received by the sequencer 406, serial data is received by the sequencer 406 and furnished to the bus AD(0:7) through the microcontroller interface 402. The Write sequence is similar to the Ready/Busy Poll, except that no flag is returned, and serial data is furnished from the microcontroller interface 402 through the sequencer 406 to serial data line SD16 of the memory interface 410. The appropriate row of memory device 600.2 is then read or written.

Figure 7:
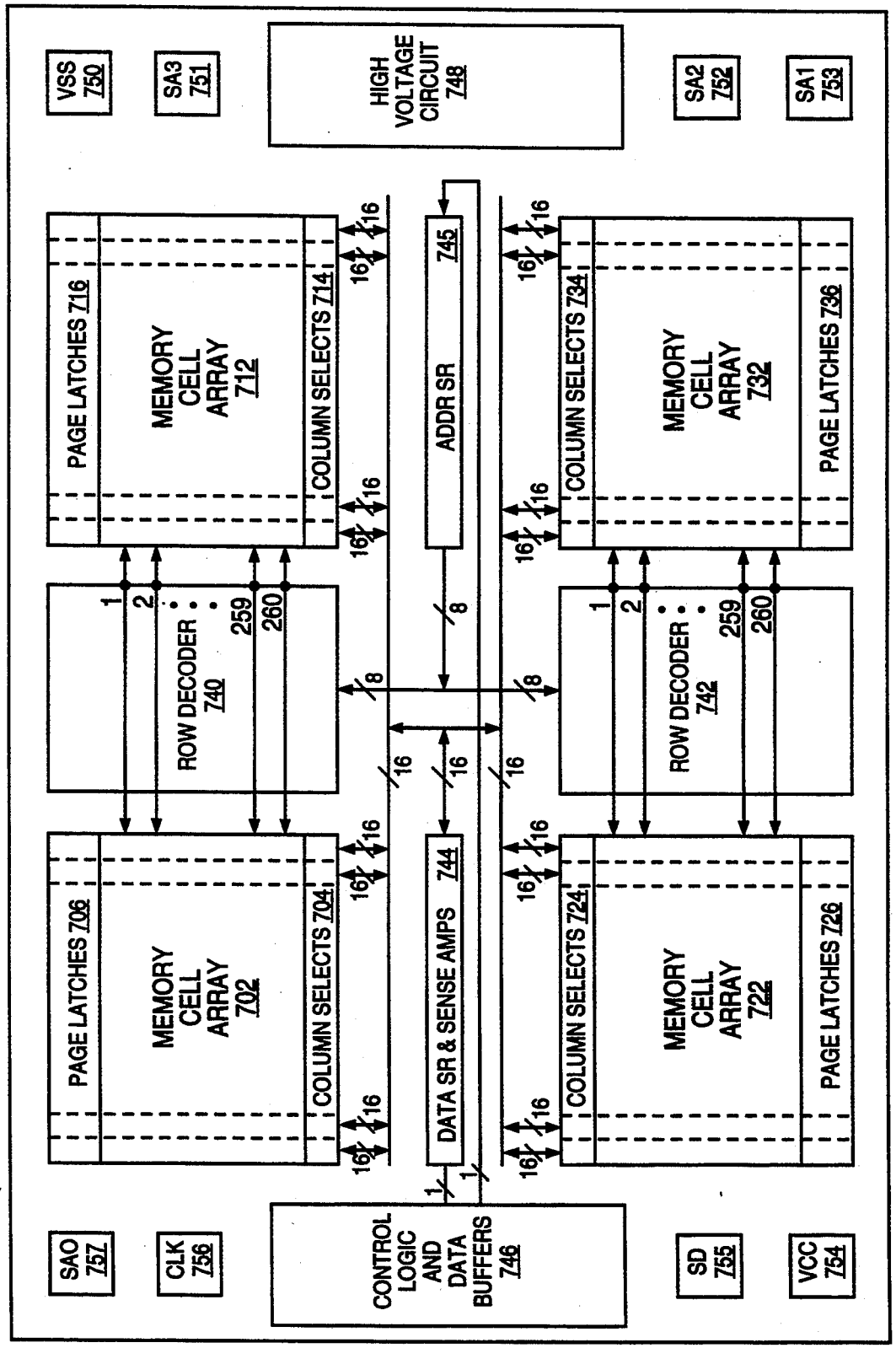
FIG. 7 is a block schematic diagram of a serial memory device of the memory array of FIG. 6.

An illustrative one megabit serial memory device 700 is shown in further detail in FIG. 7. The memory device 700 comprises four EEPROM memory cell arrays 702, 712, 722 and 732. Row decoder 740 controls word select of the memory cell arrays 702 and 712, while row decoder 742 controls word select of the memory cell arrays 722 and 732. The cell array 702 is associated with column selects 704 and page latches 706. Similarly, the cell array 712 is associated with column selects 714 and page latches 716; the cell array 722 is associated with column selects 724 and page latches 726; and the cell array 732 is associated with column selects 734 and page latches 736. The data path of the memory device 700 includes data shift registers and sense amps 744, row address shift register 745, and control logic and data buffers 746. Control signals are provided by control logic and data buffers 746. Other elements of the memory device 700 include the high voltage circuits 748 and the various pads for pin connection. These pads are supply voltage pads Vcc 754 and Vss 750, serial clock pad 756, serial data pad 755, and static address pads 757, 753, 752 and 751 corresponding to SA0, SA1, SA2 and SA3 respectively.

The arrangement of FIG. 7 results in an integrated circuit that is of a convenient conventional shape. Alternatively, a smaller layout can be achieved by arranging the memory cell arrays 702, 712, 722 and 732 in one long row, in association with only a single row decoder such as 740. This alternative layout would result in a long, thin integrated circuit.

Generally, the operation of the serial memory device 700 is as follows. An address is shifted into the row address shift register 745 one bit at a time, the address is decoded by both row decoders 740 and 742, and the corresponding rows of memory cell arrays 702, 712, 722 and 732 are selected. An entire sector of data, 512 bytes or 4096 bits, is written to or read from the memory cell arrays 702, 712, 722 and 732 via respective page latches 706, 716, 726 and 736. Input to or output from the page latches is progressively moved in 16 bit segments between the sixteen bit data shift registers and sense amps 744 and the page latches 706, 716, 726 and 736. Input to or output from the data buffers 746 is moved from the data shift register and the row address shift register one bit at a time, bit by bit.

Figure 8:
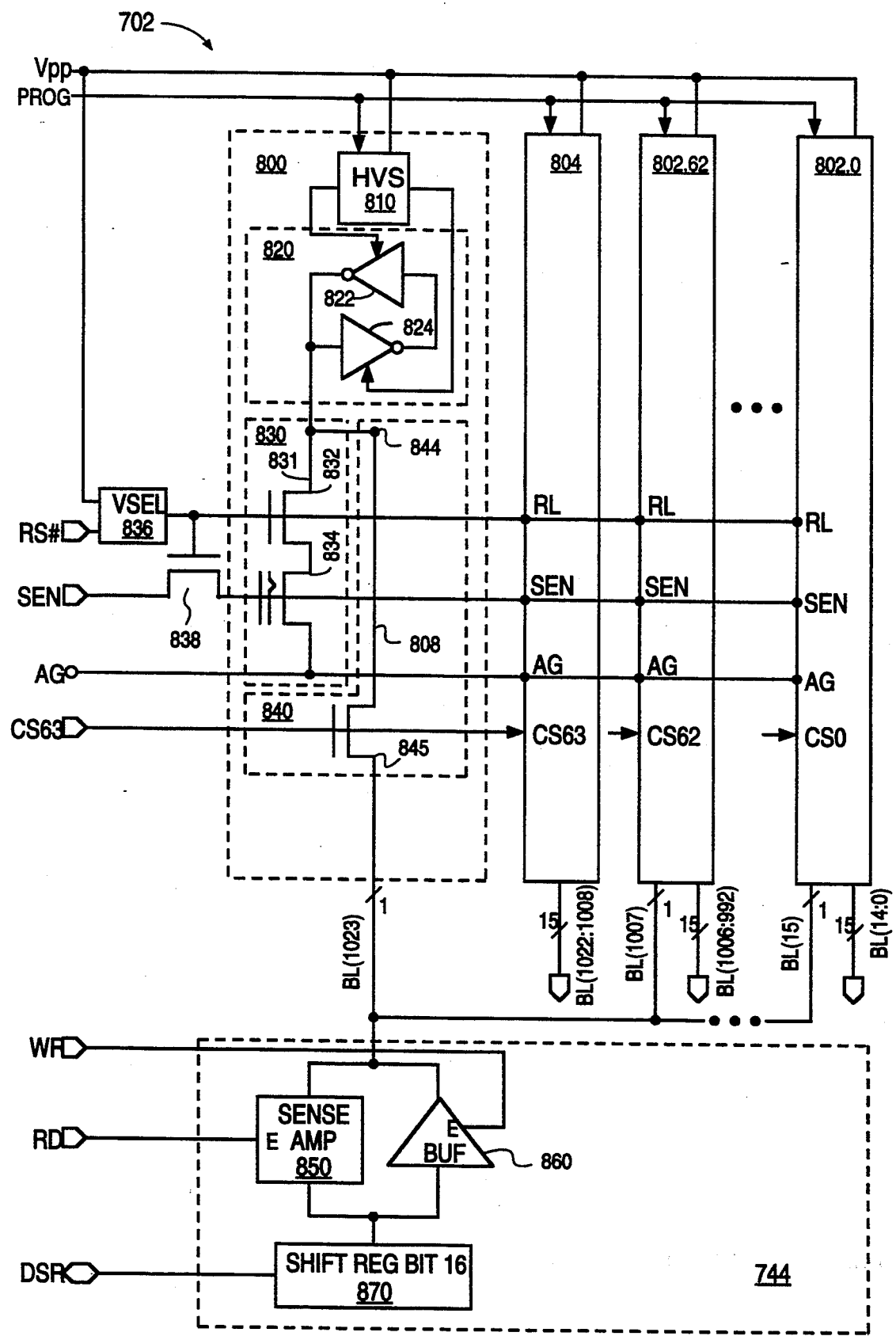
FIG. 8 is a circuit schematic diagram of a memory cell and associated circuitry, which form part of the serial memory device of FIG. 7.

A memory column 800 suitable for use in the memory cell arrays 702, 712, 722 and 732 is shown in greater detail in FIG. 8. The memory column 800 is associated with bit line BL(1023), and includes a high voltage programming supply 810, a page latch 820, a column select 840, and two hundred fifty six memory cells such as cell 830 connected to node 844. These may be of any suitable design. For example, the high voltage supply 810 may be of any suitable type, including the type described in Lucero et al., "A 16 kbit Smart 5 V-Only EEPROM with Redundancy," IEEE Journal of Solid-State Circuits, Vol. SC-18, No. 5, October 1983, which is incorporated herein by reference in its entirety. The page latch may be conventional cross-coupled inverters 822 and 824. The memory cell may be, for example, a conventional EEPROM cell having an n-type EEPROM transistor 834 with its gate connected to sense voltage transistor 838, its source connected to array ground AG, and its drain connected to a bit line 808 through an n-type row select transistor 832. The sense voltage transistor 838 is connected to line SEN and is controlled by the output of the voltage select circuit 836 applied to its gate. The gate of select transistor 832 is connected to row select line voltage select circuit 836. The sense voltage select circuit 836 receives Vpp and is controlled by row select line RS# (# indicates a select line in the range of 1 to 256) from the associated row decoder (one of decoders 740 and 742). The column select 840 may be, for example, a conventional n-type transistor 845 provided in the bit line 808, with its gate connected to an appropriate column select line such as CS63.

Sixteen memory columns are grouped to form a word column. The word columns 802.63–802.0 of the memory cell array 702 are controlled by respective column select lines CS63–CS0, although they share common row select lines such as line RS#, a common sense line SEN, and a common array ground line AG. Each of the word columns 802 (not shown) of the memory arrays 712, 722 and 732 are configured in a similar manner. All array ground lines are commonly connected, as are all sense lines. The row select lines of adjacent memory cell arrays such as 702 and 712, and 722 and 732 in FIG. 7, are commonly connected.

Bit line BL(1023), which is the most significant bit of the word column 802.63, is connected along with the most significant bits of all other word columns 802 in the memory cell arrays 702, 712, 722 and 732, to sense amplifier 850 and buffer amplifier 860, which are associated with the shift register sixteenth bit 870 in the data shift register and sense amplifier circuit 744. The sense amplifier 850 is of any suitable design such as, for example, a conventional single ended sense amplifier. The buffer amplifier 860 is of any suitable design. Each other bit of the data shift register 744 similarly is associated with a sense amplifier, a buffer amplifier, and a bit line.

The memory element 800 controllably operates in one of four modes, a read mode, a write mode, an erase mode, and a program mode. In read mode, CS63 is five volts to connect the internal bit line 808 to the external bit line BL(1023). During this mode, Vpp is five volts, and that value is supplied to the inverters 822 and 824 of the latch 820 by the high voltage supply 810. RS# is five volts, SEN is about two to three volts, and AG is zero volts, so that the value in EEPROM transistor 834 is sensed by sense amp 850 and loaded into shift register 870. In write mode, CS63 is five volts to connect the internal bit line 808 to the external bit line BL(1023). The bit line 808 is driven with the appropriate data value, which is latched in latch 820. During this mode, Vpp is five volts, and that value is supplied to the inverters 822 and 824 of the latch 820 by the high voltage supply 810. RS# is zero volts, SEN is zero volts, and AG is zero volts to isolate the value stored in EEPROM transistor 834 form the latch 820. In erase mode, CS63 is zero volts to isolate the internal bit line 808 from the external bit line BL(1023) and the internal bit line 808 is allowed to float. During this mode, the value of Vpp is twenty volts. RS# is twenty volts, SEN is twenty volts, and AG is zero volts to erase the floating gate of the EEPROM transistor 834. In program mode, CS63 is zero volts to isolate the internal bit line 808 from the external bit line BL(1023) and the signal level on the internal bit line 808 is either zero or twenty volts, depending on the data in the latch 820. During this mode, the inverters 822 and 824 of the latch 820 receive Vpp, or about twenty volts, from the high voltage supply 810. RS# is twenty volts, SEN is zero volts, and AG is floating to program the floating gate of the EEPROM transistor 834 in accordance with the value stored in latch 820. Note that in other circuit designs, the voltage levels may be different.

Figure 9:
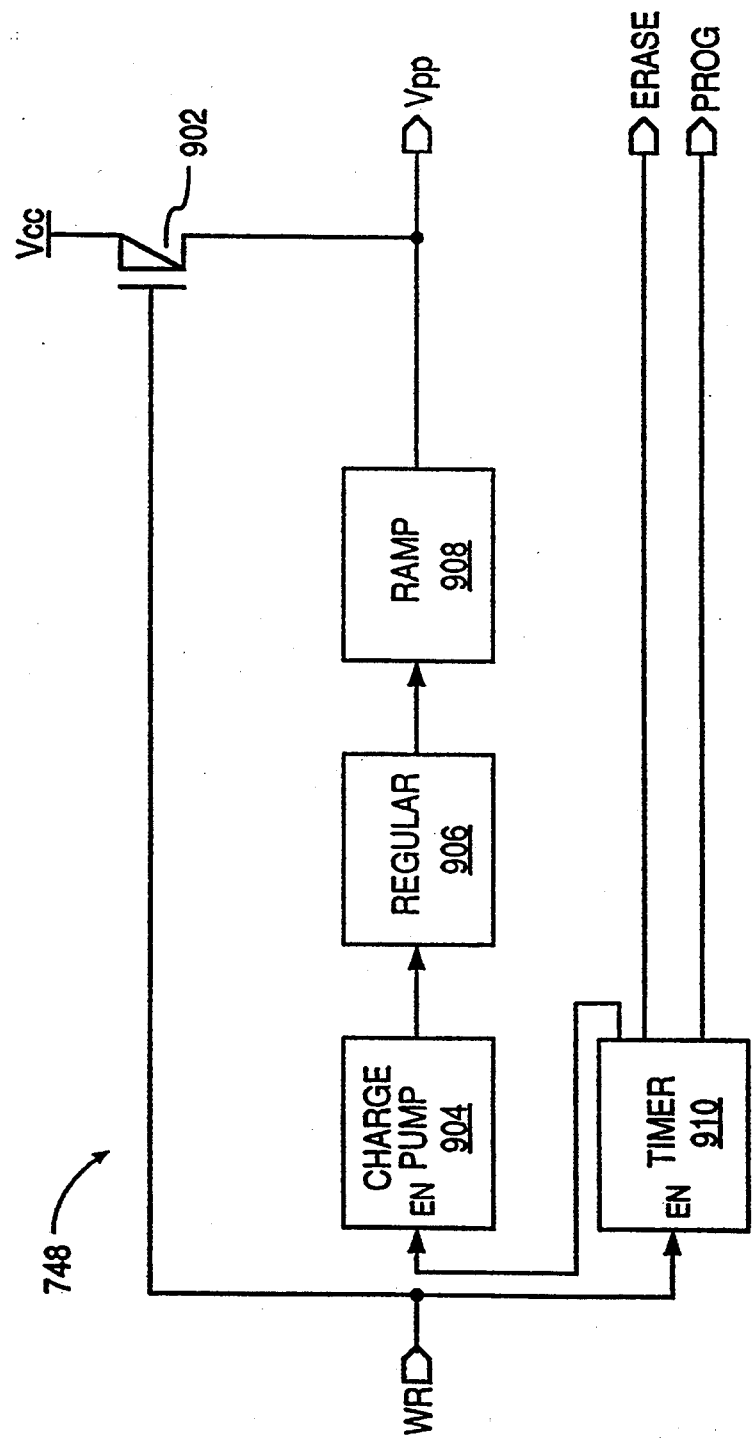
FIG. 9 is a block schematic diagram of a high power circuit of the serial memory device of FIG. 7.

A block diagram of the high voltage circuit 748 for supplying Vpp is shown in FIG. 9. When line WR is LOW, the charge pump 904 is inactive and p-type transistor 902 is conductive, so that about five volts is supplied on line Vpp. When WR goes HIGH, the charge pump 904 is enabled to generate from about twenty to twenty-five volts, and the timer 910 is enabled to sequentially generate signals on lines ERASE and PROG which are used in the programming of the memory array 124. Signal ERASE in particular is used for controlling the voltage level of signal SEN, and is active in the erase mode. Vpp is obtained from the output of charge pump 904 through a voltage regulator 906, which provides a stabilized twenty volts, and a ramp circuit 908, which ramps Vpp from five to twenty volts to protect the thin 100 Angstrom gate oxide from an abrupt drain-gate voltage change.

Figure 10:
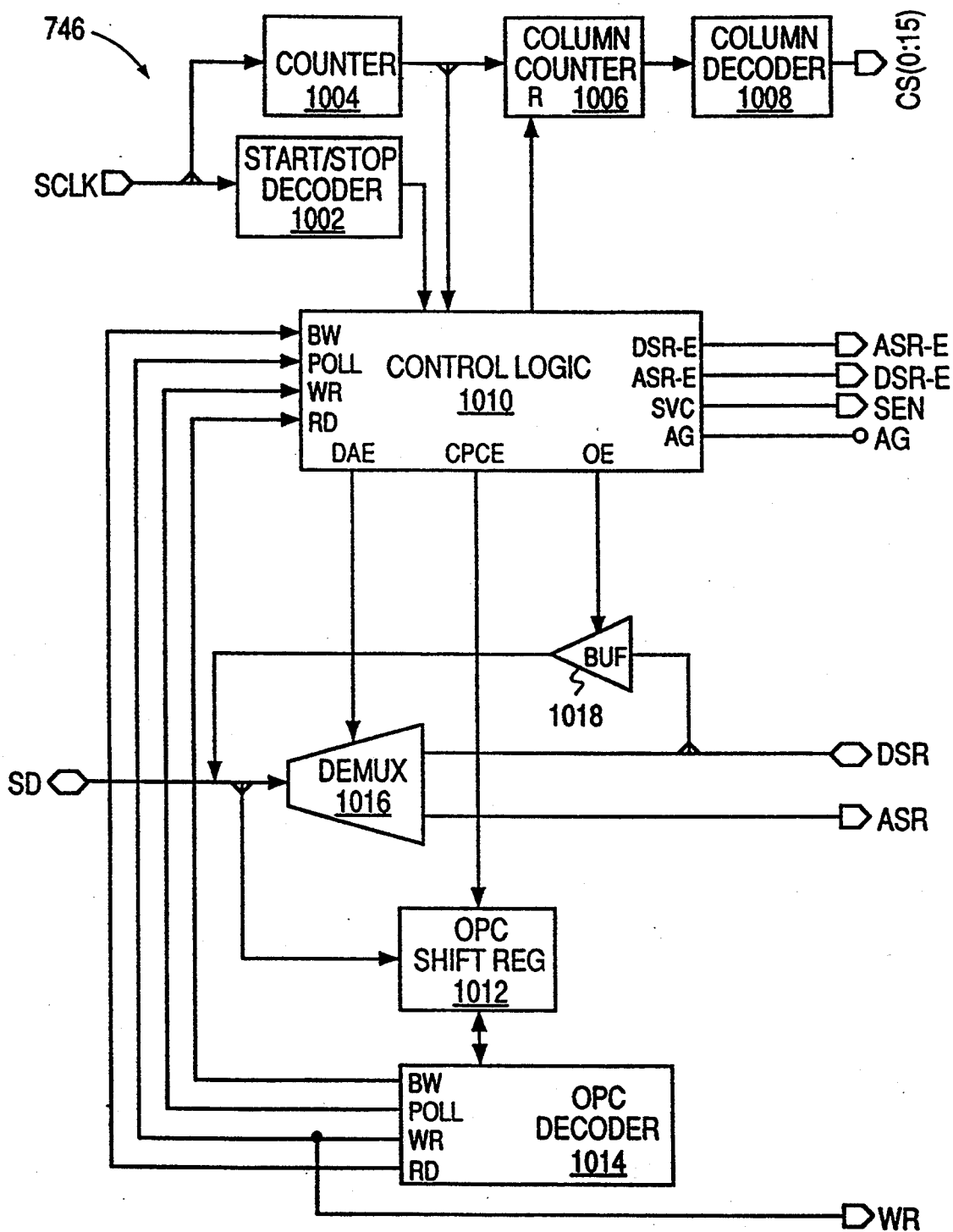
FIG. 10 is a block schematic diagram of a control logic and data buffers circuit of the serial memory device of FIG. 7.

A block diagram of the control logic and data buffers circuit 746 is shown in FIG. 10. The assertion of a clock signal on line SCLK is detected by start/stop decoder 1002, which alerts the control logic 1010. The counter 1004 begins to count the clock signals SCLK, and furnishes its output to control logic 1010 as well as to a column counter 1006. The contents of column counter 1006 are decoded by column decoder 1008, which suitably activates an appropriate one of the column select lines CS(0:15). The column counter is suitably reset by the control logic 1010.

Based on the count in the counter 1004, the control logic 1010 enables the operation code shift register 1012, which shifts in an op code, or operation code, from serial data line SD. The op code is decoded by decoder 1014, which provides an appropriate signal on either the burst write mode line BW, the poll mode line POLL, the write mode line WR, or the read mode line RD. The signal is detected by control logic 1010, which directs address data from serial data line SD through demultiplexer 1016 to the address shift register 745 (FIG. 7) over line ASR, or directs write data from the serial data line SD through the demultiplexer 1016 to the data shift register 744 (FIG. 7), or directs read data from the data shift register 744 through the buffer 1018 to serial data line SD as output. Signals for controlling the operation of the memory cell arrays 702, 712, 722 and 732; the column selects 704, 714, 724 and 734; and the page latches 706, 716, 726 and 736 include the address shift register enable signal provided to register 745 over line ASR-E, the data shift register enable signal provided to register 744 over line DSR-E, sense voltage control signal provided to the transistor 838 (FIG. 8) over line SEN, and the array ground line AG.

The operation of the serial memory device 700 in its principal modes, the read and write modes, is described with reference to FIG. 11, which illustrates bit sequences for these modes. It will be appreciated that the memory device 700 may be operated in other modes of operation for such purposes as testing and redundancy operations.

The memory device 700 enters an idle state after power up. It remains in an idle state as long as the CLK pin 756 is at a zero state. Similarly, at the end of an instruction, after the clock stops, the memory device 700 enters an idle mode approximately two microseconds after the falling edge of the last clock.

Generally, an operation sequence such as a read or a write begins with the bit sequence illustrated in FIG.

11A. It will be appreciated that the memory device 700 may be operated under other operation sequences as well. The memory device 700 exits the IDLE state as soon as it detects the rising edge of the clock CLK. At this point, the serial data pin SD is monitored. The serial data includes a four bit opcode (OP3–OP0), a twelve bit cylinder address (C11–C0), and a four bit head address (HS3–HS0). In the cylinder address, bits C7–C0 are the 8 bit row address to choose one of 256 rows, bit C8 is a static address bit that is compared to the external level of the static address pin SA0, bit C9 is a static address bit that is compared to the external level of the static address pin SA1, bit HS0 is a static address bit that is compared to the external level of static address pin SA2, and bit HS1 is a static address bit that is compared to the external level of the static address pin SA3. Note that C11, C10, HS3, and HS2 are "don't care" bits.

The last head address bit is followed by four zero bits. During the shifting of the four zero bits, the opcode instruction is decoded and the internal static address bits C9, C8, HS1, HS0 are compared to the external static address pins SA3–SA0. If the addresses match, meaning that the memory device 700 is correctly addressed, then the decoded operation, typically a read or write, is executed. If the addresses do not match, then the memory device 700 stops monitoring the SD pin and enters an idle mode.

Figure 11A:
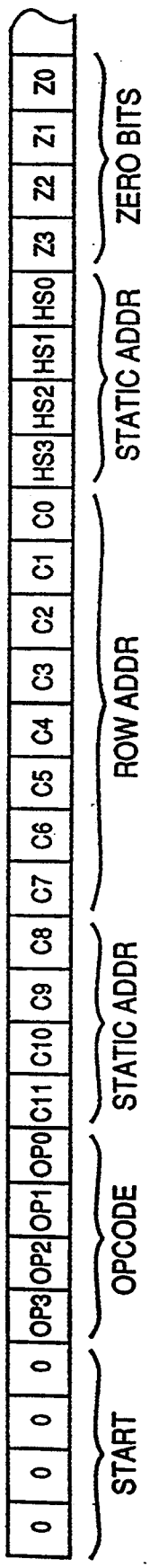
FIGS. 11a, 11b, 11c, and 11d are schematic representations of bit sequences for various modes of operation of the serial memory device of FIG. 7.
Figure 11B:
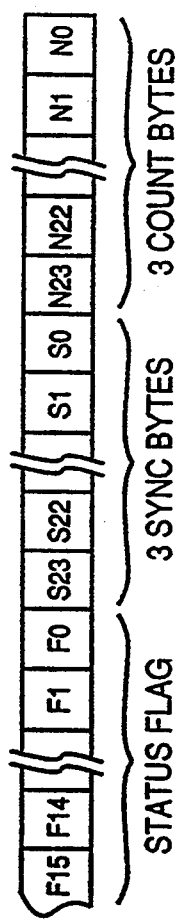
Figure 11C:
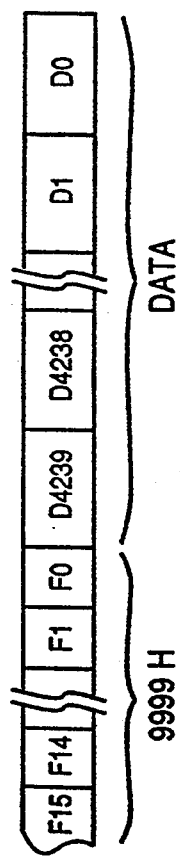

Prior to beginning a read or a write operation, the status of the memory device 700 is polled in a Ready/Busy Poll operation, the bit sequence for which is illustrated in FIG. 11B. It will be appreciated that the memory device 700 may be operated under other ready/busy poll sequences as well. After the first twenty-five clocks of Start, Opcode and Address (FIG. 11A) in which the Opcode is a Ready/Busy Poll instruction, the memory device 700 drives the SD line with the Hex word 9999 if ready, and with the Hex word 6666 if the memory is busy. After this sixteen bit Status Flag, three bytes of Sync characters and 3 bytes of Count are driven out. These are user programmable. If the memory device 700 is busy, the 6 consecutive bytes following the busy flag are ignored by the user. The total number of clocks for the Ready/Busy Poll Instruction is 89, determined as follows: Start, 1; Opcode and Address, 24; Ready/Busy Flag, 16; Sync Bits, 24; and Count Bits, 24.

The data stream is shifted out on the SD pin in the following way, with reference to FIGS. 7, 8 and 10. Every 16 clocks CLK, the data is sensed in accordance with the row selected by decoders 740 and 742 (for example, RS# in FIG. 8) and the word selected by a commonly connected group of sixteen column selects such as 840. Note that in FIG. 8, column select line CS63 controls column select circuit 840 associated with bit line BL(1023) and fifteen other column select circuits associated with, respectively, bit lines BL(1022:1008). The resulting sixteen bit word is sensed in sense amp 850 and parallel loaded into the data shift register in circuit 744 and shifted out serially. The column select decoder 1008 activates the next column select line CS#, in response to the count in the column counter 1006, and the next word of 16 bits is read by the sense amps such as 850 in circuit 744 while the first 16 bits are shifted out on line DSR. This continues until the entire Row of 4240 bits is read, with the data appearing on line DSR as an uninterrupted stream of 4240 bits. After all 4240 data bits are shifted out the circuit 744 and on the SD pin SD through line DSR and buffer 118 (FIG. 10), the clock CLK stops and stays at zero volts for 2 microseconds. This condition is sensed by the start/stop decoder 1002, which causes control logic 1010 to enter the idle state waiting for the next rising edge of the clock SCLK.

Figure 11D:
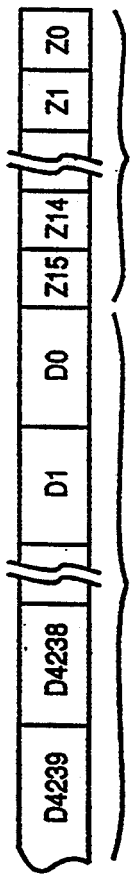

A write mode sequence begins with the general operation sequence illustrated in FIG. 11A, and continues with the sequence illustrated in FIG. 11D. It will be appreciated that the memory device 700 may be operated under other write sequences as well. After the first twenty-five clocks of Start, Opcode and Address (FIG. 11A) in which the Opcode is decoded as a valid Write instruction during the shifting of the four Zero Bits, and a match of the static address bits with the static pin addresses is verified; the memory device 700 receives a 4240 bit data stream D4239–D0, and sixteen zero bits for allowing the last word to be read. The total number of clocks for the Write Instruction is 4281, determined as follows: Start, 1; Opcode and Address, 24; Data, 4240; and Zero Bits, 16.

The data stream is shifted in from the SD pin in the following way, with reference to FIGS. 7, 8, 9 and 10. After sixteen clocks CLK during which data is shifted into the shift register of circuit 744, the entire sixteen bits of the shift register of circuit 744 is latched into a memory word column such as 802.63 in accordance with the row selected by decoders 740 and 742 (for example, RS# in FIG. 8) and the word selected by a commonly connected group of sixteen column selects such as 840. Note that in FIG. 8, column select line CS63 controls column select circuit 840 associated with bit line BL(1023) and fifteen other column select circuits associated with, respectively, bit lines BL(1022:1008). For example, the logic value in shift register bit sixteen 870 is driven onto bit line BL(1023) by buffer amplifier 860, and is latched into latch 820 through column select transistor 842 in one clock SCLK. The column select decoder 1008 activates the next column select line CS#, in response to the count in the column counter 1006, and the next word of 16 bits are latched into the appropriate memory word column. This continues until the entire Row of 4240 bits is latched, with the data appearing on line DSR as an uninterrupted stream of 4240 bits.

At this point, an extra 16 clocks are clocked in to make sure that the last word has been loaded in the page latches. The use of sixteen clock pulses at this time is convenient, so that the memory column 800 may be designed with relaxed criteria. A faster loading of the page latch 820 may be achieved by designing the memory column 800 to have a reduced impedance.

After all 4240 data bits are shifted into the circuit 744 from the SD pin SD through the demultiplexer 116 and line DSR, and after the sixteen additional clock pulses, the clock CLK stops and stays at zero volts for 2 microseconds. This condition is sensed by the start/stop decoder 1002, which causes control logic 1010 to enter the idle state waiting for the next rising edge of the clock SCLK. The total count is detected by the timer 910, which enables the charge pump 904 and activates ERASE and PROG to program the EEPROM transistors in the selected row of the memory array 124 during a 5 millisecond interval, in a conventional manner. It will be appreciated that the programming interval may be lesser or greater in other implementations, depending on the technology and type of memory used.

During the EEPROM programming of a given bank, read and write operations may be performed on other banks. If the bank being programmed is polled, however, it will return a Busy Flag.

A block write instruction is carried out in a manner similar to the write instruction, except that the lower eight bits (C7:C0) of the address field are ignored. Subsequently, the data loaded in the page latches is written to all the rows. Note that a block erase is performed by doing a block write operation and loading in the page latches the Hex data FFFF. The block write is also useful for testing.

It will be appreciated that the disk emulator interface 122 and the serial memory devices 600 of the memory array 124 can be designed in any suitable technology using any suitable CAD system, and manufactured under any suitable process.

One embodiment of a twenty megabyte solid state hard disk based on the architecture described above was specified with an average access time of 1 ms, a maximum access time of 2.5 ms, power supply voltage of 5 volts plus/minus 10%, a maximum power dissipation of 200 mA, a standby power dissipation of 20 mA, an operating temperature of 0 degrees C. to 70 degrees C. The embodiment was designed with host throughput of 3 MB/S asynchronous and 5 MB/S synchronous, SCSI compliance CCS 4.B full 48 mA SCSI bus drivers, non-volatile storage, 24 Mbit NRZ data rate, 56 bit ECC, and a 32 K data buffer for 1:1 interleaving.

Figure 12:
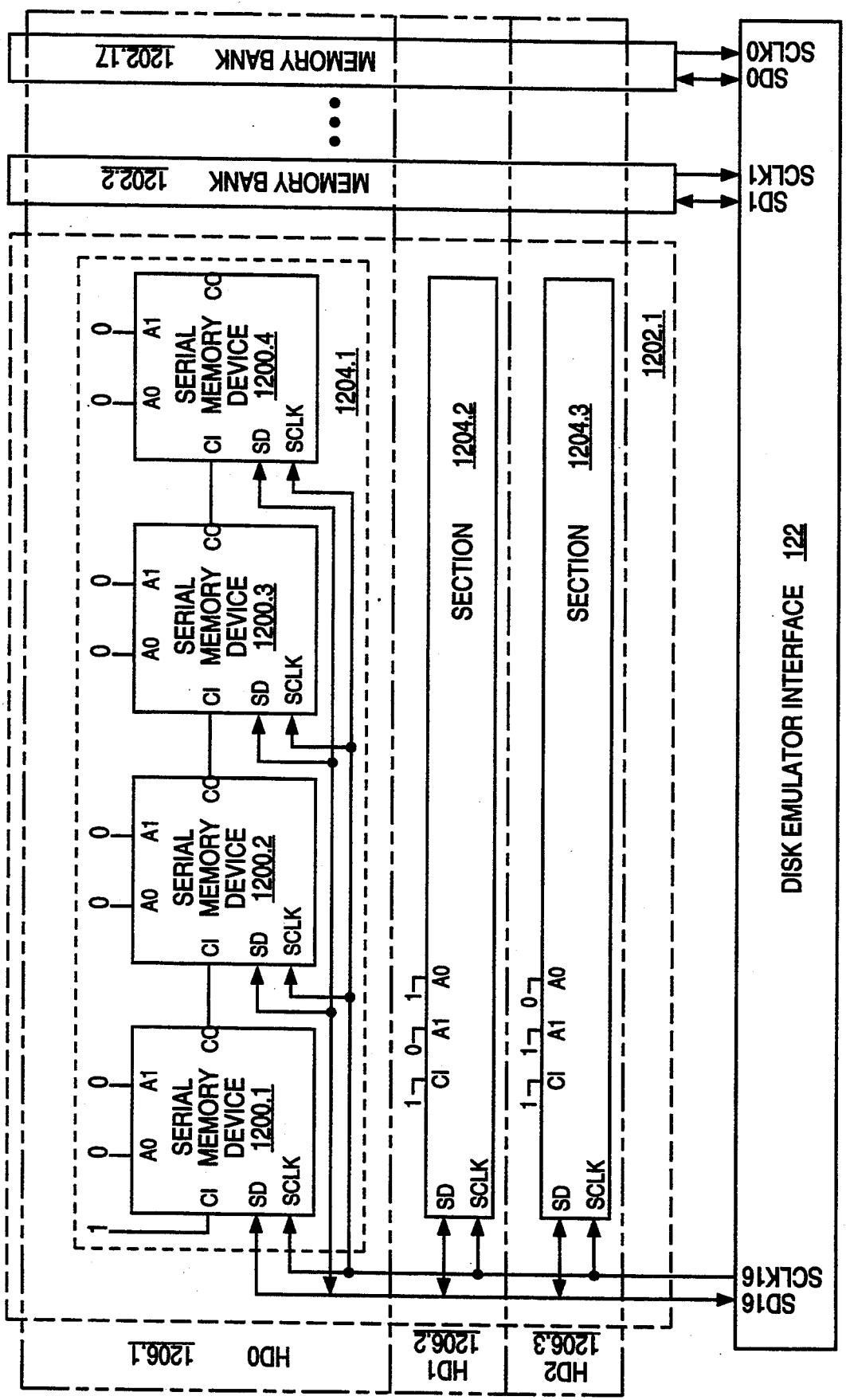
FIG. 12 is a block schematic diagram of another memory array having a plurality of serial memory devices.

Another disk emulator section embodiment is shown generally in FIG. 12. Each of the serial memory devices 1200 is one megabyte, arranged in a 1024×1024 cell array. Since one sector is equal to 512 bytes or 4096 bits, 4 memory devices 1200 are used to create a row of 4096 bits. For example, in the first bank 1204.1, section 1204.1, which comprises serial memory devices 1200.1, 1200.2, 1200.3 and 1200.4, contains all first sectors on head HD0. Similarly, the section 1204.2, which comprises four serial memory devices 1200 (not shown), contains all first sectors on head HD1; and the section 1204.3, which comprises four serial memory devices 1200 (not shown), contains all first sectors on head HD2. Where the size of the serial memory devices four megabits, only a single memory device would be required per section 1204.

As in the case of the memory array 124 shown in FIG. 6, the memory array of FIG. 12 is divided into seventeen banks 1202.1–1202.17, in accordance with the convention that each bank corresponds to one of seventeen sectors (FIG. 5) of the magnetic media hard disk being emulated. If desired, however, a bank may correspond to two or more sectors depending on the convention being adhered to, and a fewer or greater number of banks may be used depending on the magnetic media hard disk being emulated. Moreover, additional banks may be included to provide for redundancy in the event of defective memory. Each of the banks 1202.1–1202.17 includes three sections, or groups of memory cells, corresponding to the emulated hard disk heads HD0 (1206.1), HD1 (1206.2) and HD2 (1206.3). For example, bank 1202.1 includes sections 1204.1, 1204.2 and 1204.3 corresponding to heads HD0 (1206.1), HD1 (1206.2) and HD2 (1206.3).

As in the case of the serial memory devices 600 in the memory array 124 of FIG. 6, each serial memory device 1200 of the memory array of FIG. 12 includes power and ground (not shown), and communicates on, basically, two buses, the serial clock bus SCLK and serial data bus SD. All the serial clock buses SCLK of the memory devices 1200 within one bank (for example, memory devices 1200.1–1200.4 in bank 1202.1, section 1204.1) are commonly connected, and all the serial data buses SD of the memory devices 1200 within one bank are also commonly connected. The buses SCLK(0:16) and SD(0:16) from the disk emulator interface 122 each comprise seventeen lines, or one pair of lines SCLK# and SD# for each bank, in order to reduce driver requirements and minimize power consumption.

The memory cell 1200 lacks the static address terminals SA1 and SA0 of the serial memory device 600, since the entire range of tracks typically addressed by one head, viz. 1024, are contained in one memory device 1200. However, each memory device 1200 does includes static address terminals A0 and A1, which like terminals SA3 and SA2 of the serial memory devices 600 of FIG. 6 are connected to Vcc or ground, as appropriate, for establishing the head address of a memory device 1200.

The illustrative serial memory device 700 of FIG. 7 is suitable for use as the serial memory devices 1200 shown in FIG. 12, with certain modifications. The logic responsive to static addresses SA2 and SA3 is removed, the pins are renamed CI and CO for carry-in and carry-out respectively, and a counter and control logic (not shown) are added to controllably generate output CO in response to CI and the clock signal SCLK#, as now described.

Each serial memory device 1200 includes a carry-in input CI and a carry out CO, which are used to enable and disable clocking. Otherwise, the operation is similar to the serial memory device 700 of FIG. 7. The feature of enabling a serial memory device 1200 upon assertion of signal CI, which is provided by the CO of the preceding serial memory device 1200, provides an advantage of the memory array of FIG. 12 over the memory array of FIG. 6 in the respect that power consumption is further reduced without adversely affecting the continuity of the high data rate. Initially, only serial memory device 1200.1 in section 1204.1 is clocked; similarly, the counterparts of serial memory device 1200.1 in sections 1204.2 and 1204.3 are clocked. Hence, only three memory devices in the memory array of FIG. 12 are clocked at any one time. In contrast, twelve memory devices 600 in the memory array 124 of FIG. 6 are clocked at a time. When memory device 1200.1 and its counterparts are empty, CO goes HIGH, and enables clocking of memory device 1200.2 in section 1204.1 and its counterparts in sections 1204.2 and 1204.3. This procedure is repeated until all memory devices in the selected bank are empty, without breaking the continuity of the high data rate.

The serial memory devices 700 and 1200 may be further modified to accommodate multiple sectors in one bank. As shown without modification, the memory arrays of FIGS. 6 and 12 are partitioned into banks of different sectors to permit access to other sectors during the 5 millisecond EEPROM programming period of one sector. When, however, a large number of banks are used, the number of wire pairs for control increases with the number of banks. In this case, the use of a multiple sectors per bank arrangement reduces the number of wire pairs needed. To accommodate multiple sectors per bank, a modified serial memory device includes an additional mode to permit each sector on the same bank to have a unique address. On power-up, the modified serial memory device is issued a "set address" command. On each clock pulse, if CI is HIGH for a particular memory device, CO goes HIGH. Internally, each memory device counts the number of clock pulses elapsed until its CI goes HIGH, and uses that count as its address. For example, in FIG. 12, memory device 1200.1 might acquire an address of ONE since its CI is tied HIGH, and memory device 1200.2 might acquire an address of TWO.

The technique for generating the programming voltage Vpp may be varied. Typically, Vpp is generated on each device by charge pumping, so that power consumption is quite high. Alternatively, one of the memory devices of a bank (or a sector in a multiple sector bank) is designated by use of its SD# and SCLK# lines as a source for the programming voltage, and its charge pump alone is turned on to program the entire bank (or all same-numbered sectors of a multiple sector bank). Similarly, one of the memory devices of a bank (or a sector in a multiple sector bank) is designated as a timer, and its Erase and Program functions used to control the functions of the entire bank (or all same-numbered sectors of a multiple sector bank).

While the present invention has been described with respect to certain embodiments, the scope of the present invention is defined by the appended claims and is not necessarily limited to the embodiments described herein, which are merely illustrative. For example, the design and fabrication technology and the memory technology (other types of memory suitable for use in the various banks of the solid state hard disk include, for example, static random access memory, dynamic random access memory with battery backup, flash memory, and ferroelectric random access memory), are illustrative. Accordingly, other embodiments and variations not described herein may be within the scope of our invention, as defined by the appended claims.

What is claimed is:

1. A serial memory device comprising:
   a first serial port;
   a first clock port;
   an array of memory cells arranged in a plurality of columns of a predetermined width;
   an address/data control circuit coupled to the serial port and the clock port;
   a row decoder coupled to the memory array;
   an address shift register coupled to the control circuit by a first serial bus, and coupled to the row decoder by an address bus;
   a plurality of column select circuits respectively coupled to the columns of the memory array; and
   a data shift register coupled to the control circuit by a second serial bus, and coupled to the column select circuits by a word bus, the width of the data shift register being the predetermined column width.

2. A serial memory device as in claim 1 further comprising:
   a plurality of page latch circuits respectively coupled to the columns of the memory array;
   means for activating selected ones of the column select circuits;
   means for transferring data in parallel from the data shift register through the activated column select circuits to respective ones of the page latches; and
   means for transferring the data from the page latches to addressed memory cells in the memory array.

3. A serial memory device as in claim 2 wherein the memory cells are EEPROM memory cells and the data transferring means comprises:
   means for erasing the addressed memory cells in the memory array; and
   means for programming the addressed memory cells in the memory array with the data in the page latches.

4. A serial memory device as in claim 1 wherein the columns of the array of memory cells collectively providing a sector of data at each memory address.

5. An apparatus as in claim 4, wherein data is latched in a number of clock pulses equal to the number of columns.

6. A serial memory device as in claim 1 wherein the columns of the array of memory cells collectively providing a plurality of sectors of data at each memory address.

7. An apparatus as in claim 6, wherein data is latched in a number of clock pulses equal to the number of columns.

8. An apparatus as in claim 1, wherein the memory array contains five hundred twelve bytes, and the predetermined width of the columns is 16 bits.

9. An apparatus as in claim 1, further comprising:
   means for detecting a continuous low state for a predetermined interval both on the serial port and on the clock port; and
   means responsive to the detecting means for indicating a start condition upon a low to high transition on the clock port.

10. An apparatus as in claim 1, further comprising:
    a timer for determining an interval;
    means for detecting a high to low signal transition on the serial port while the signal level on the clock port is low;
    means responsive to the detecting means for initiating the timer; and
    means responsive to the timer for confirming a start condition if no transition occurs on the clock port during the interval, and for invalidating the start condition if a transition occurs on the clock port during the interval.

11. A serial memory device as in claim 1 further comprising:
    a head static address port;
    means for comparing a head static address from the serial port with a head static address indicated on the head static address port; and
    means for activating the serial memory device when the comparing means indicates a match.

12. A serial memory device as in claim 1 further comprising:
    a head static address port;
    means for comparing a head static address from the serial port with a head static address indicated on the head static address port;
    a track static address port;
    means for comparing a track static address from the serial port with a track static address range indicated on the track static address port; and
    means for activating the serial memory device when both the head static address comparing means and the track static address comparing means indicate a match.

13. A serial memory device as in claim 1 further comprising:
    a head static address port;
    means for comparing a head static address from the serial data port with a head static address indicated on the head static address port;

a carry-in port;
a carry-out port;
means for activating the serial memory device when a signal is asserted on the carry-in port;
means for deactivating the serial memory device after a predetermined number of clock pulses occur on the clock port following activation of the serial memory device by the activating means; and
means for asserting a signal on the carry-out port upon deactivation of the serial memory device by the deactivating means.

14. A serial memory device as in claim 1 wherein the memory cells are EEPROM memory cells.

15. A serial memory apparatus comprising:
a first serial port;
a first clock port;
an address/data control circuit coupled to the serial port and to the clock port;
an address shift register coupled to the control circuit by a first serial bus;.
a data shift register coupled to the control circuit by a second serial bus; and
an addressable memory having an address port coupled to the row decoder and a data input/output port coupled to the data shift register.

16. An apparatus as in claim 15 wherein the addressable memory comprises:
a row decoder coupled to the address shift register;
a plurality of column select circuits coupled to the data shift register, the column select circuits being arranged in groups with the groups of column select circuits being coupled to respective column select lines and the column select lines being coupled to the control circuit, and each bit of the data shift register being coupled to at least one of the column select circuits in each of the groups; and
a memory array arranged in a plurality of rows and columns, the rows of the memory array being coupled to the row decoder, and the columns of the memory array being coupled to the column select circuits.

17. An apparatus as in claim 16 further comprising: control logic;
a demultiplexer having an input coupled to the serial port, a first output coupled to the address shift register, a second output coupled to the data shift register, and a control input coupled to the control logic; and
a buffer having an input coupled to the data shift register, an output coupled to the serial port, and a control input coupled to the control logic.
a counter having a clock input coupled to the clock port;
a column counter having a clock input coupled to an output of the counter and a control input coupled to the control logic; and
a column decoder having an input coupled to an output of the column counter and having outputs coupled to the column select lines.

18. An apparatus as in claim 17 further comprising a start/stop decoder having an input coupled to the clock port and an output coupled to the control logic.

19. An apparatus as in claim 16 wherein the columns of the memory array collectively provides a sector of data at each memory address.

20. An apparatus as in claim 16 wherein the columns of the memory array collectively provides a plurality of sectors of data at each memory address.

21. An apparatus as in claim 16 wherein each column of the memory array comprises a data latch.

22. An apparatus as in claim 15 wherein the control circuit comprises:
control logic;
a demultiplexer having an input coupled to the serial port, a first output coupled to the address shift register, a second output coupled to the data shift register, and a control input coupled to the control logic; and
a buffer having an input coupled to the data shift register, an output coupled to the serial port, and a control input coupled to the control logic.

* * * * *